United States Patent
Tsai et al.

(10) Patent No.: US 12,278,203 B2
(45) Date of Patent: Apr. 15, 2025

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Chen-Yu Tsai, Taoyuan (TW); Ku-Feng Yang, Hsinchu County (TW); Tsang-Jiuh Wu, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 380 days.

(21) Appl. No.: 17/841,686

(22) Filed: Jun. 16, 2022

(65) Prior Publication Data

US 2023/0411326 A1 Dec. 21, 2023

(51) Int. Cl.
*H01L 23/00* (2006.01)

(52) U.S. Cl.
CPC .............. *H01L 24/08* (2013.01); *H01L 24/80* (2013.01); *H01L 2224/08111* (2013.01); *H01L 2224/08145* (2013.01); *H01L 2224/80895* (2013.01); *H01L 2224/80896* (2013.01)

(58) Field of Classification Search
CPC . H01L 2924/49402; H01L 2224/08145; H01L 24/80; H01L 2224/08111; H01L 2224/808
See application file for complete search history.

(56) References Cited

U.S. PATENT DOCUMENTS 10,811,390 B2 * 10/2020 Chen ................. H01L 23/49822
2023/0022736 A1 * 1/2023 Tanaka .................... H01L 33/60

* cited by examiner

*Primary Examiner* — Karen Kusumakar
*Assistant Examiner* — Alex Konic
(74) *Attorney, Agent, or Firm* — JCIPRNET

(57) ABSTRACT

A semiconductor structure including a first die, a second die stacked on the first die, a smoothing layer disposed on the first die and a filling material layer disposed on the smoothing layer. The second die has a dielectric portion and a semiconductor material portion disposed on the dielectric portion. The smoothing layer includes a first dielectric layer and a second dielectric layer, and the second dielectric layer is disposed on the first dielectric layer. The dielectric portion is surrounded by the smoothing layer, and the semiconductor material portion is surrounded by the filling material layer. A material of the first dielectric layer is different from a material of the second dielectric layer and a material of the filling material layer.

17 Claims, 20 Drawing Sheets

SEMICONDUCTOR STRUCTURE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
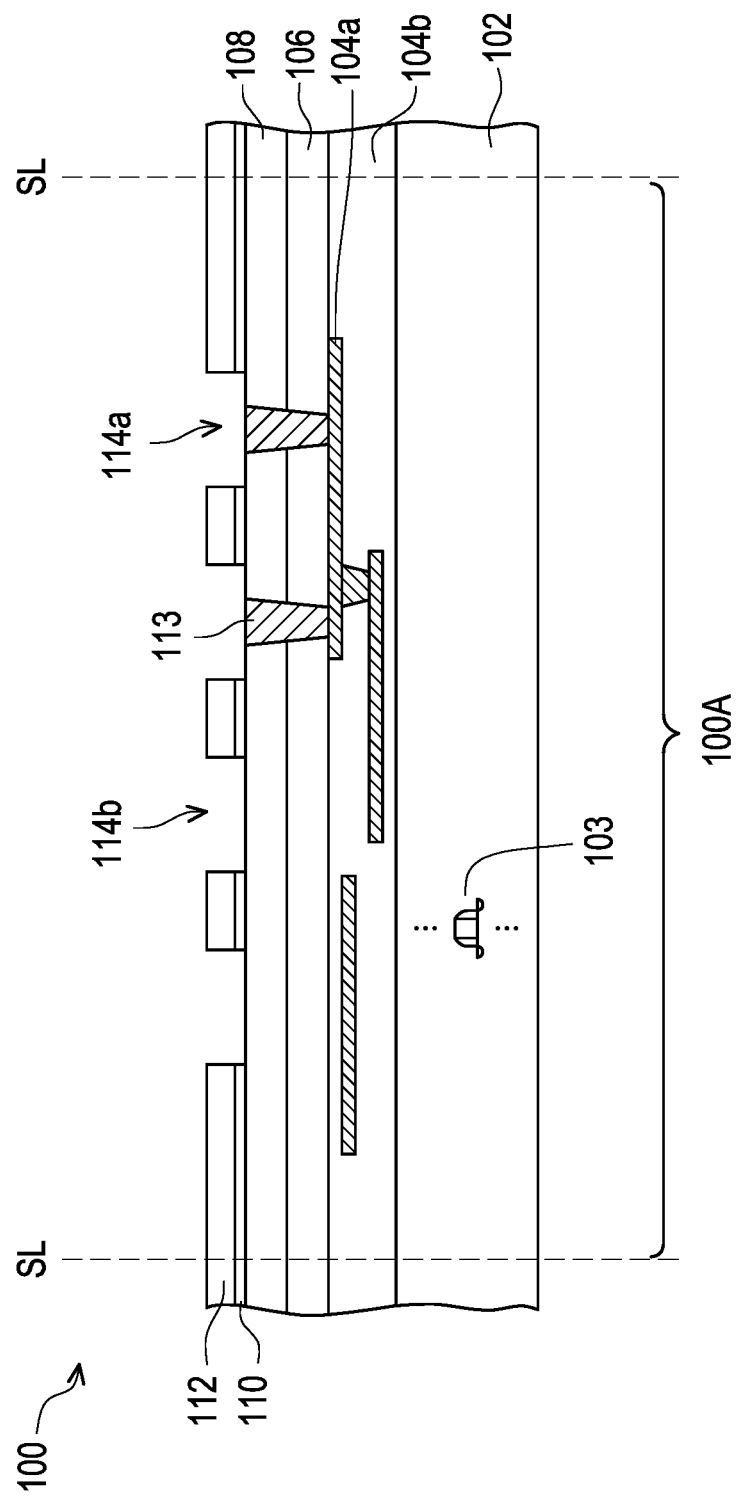
FIG. 1 through FIG. 7 are cross-sectional views schematically illustrating various stages of a process for fabricating a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 7 are cross-sectional views schematically illustrating various stages of a process for fabricating a semiconductor structure in accordance with some embodiments of the present disclosure.

Referring to FIG. 1, in some embodiments, a first wafer 100 is provided, and the first wafer 100 includes a semiconductor substrate 102 and first metallization structures 104a embedded within an insulation layer 104b formed on the semiconductor substrate 102. In some embodiments, the insulation layer 104b includes one or more low-k dielectric layers. In some embodiments, a material of the insulation layer 104b includes silicon oxide, silicate glass such as boro-phospho-silicate glass (BPSG) or PSG, a spin-on dielectric material, a low-k dielectric material or a combination thereof. In some embodiments, the first metallization structures 104a, functioning as interconnects, include multiple metallization layers having interconnected metal lines, vias and contact pads. In some embodiments, the materials of the first metallization structures 104a include aluminum (Al), aluminum alloys, copper (Cu), copper alloys, titanium (Ti), tungsten (W), or combinations thereof.

In some embodiments, the first wafer 100 is a semiconductor wafer made of silicon (such as a silicon bulk wafer) or other semiconductor materials, such as III-V semiconductor materials. In some embodiments, the first wafer 100 may be considered to have a plurality of first dies 100A (defined by the scribe lanes SL) before dicing or singulation (one die unit is shown in FIG. 1). It is understood that the number of the first dies 100A is merely exemplary, and the first dies 100A may be the same type of dies or dies of the same functions.

In some embodiments, semiconductor devices 103 may be formed in the semiconductor substrate 102 of the first wafer 100 during the front-end-of-line (FEOL) processes. In some embodiments, the semiconductor devices are transistors, memories or power devices, or other devices such as capacitors, resistors, diodes, photo-diodes, sensors or fuses. In exemplary embodiments, the semiconductor devices 103 are electrically connected with the first metallization structures 104a and some of the semiconductor devices 103 are electrically interconnected through the first metallization structures 104a. The first metallization structures 104a shown herein are merely for illustrative purposes, and the first metallization structures 104a may include other configurations and may include one or more through vias and/or damascene structures.

In some embodiments, referring to FIG. 1, a first dielectric material layer 106 and a second dielectric material layer 108 are sequentially formed on the insulation layer 104b, and vias 113 are formed in the first and second dielectric material layers 106, 108 and connected to the topmost layer of the first metallization structures 104a. Later, a third dielectric material layer 110 and a fourth dielectric material layer 112 are sequentially formed on the second dielectric material layer 108 with openings 114a and 114b. In some embodiments, the openings 114a reveal the vias 113, while the openings 114b reveal the second dielectric material layer 108. In some embodiments, a material of the first dielectric material layer 106 and the second dielectric material layer 108 may be selected from silicon oxide, silicon nitride, a low-k dielectric material or a combination thereof. In some embodiments, a material of the third dielectric material layer 110 and the fourth dielectric material layer 112 may be selected from silicon oxide, silicon nitride, silicon oxynitride, silicon carbide, a polymeric material or a combination thereof.

In some embodiments, the first dielectric material layer 106, the second dielectric material layer 108, the third dielectric material layer 110 or the fourth dielectric material layer may be formed by any deposition process such as a chemical vapor deposition (CVD) process, spin-coating, lamination or a combination thereof. In some embodiments, the materials of the first dielectric material layer 106 and the second dielectric material layer 108 are different. In some embodiments, the materials of the third dielectric material layer 110 and the fourth dielectric material layer 112 are different. In some embodiments, the first dielectric material layer 106 and the third dielectric material layer 110 are of the same material, and the second dielectric material layer 108 and the fourth dielectric material layer 112 are of the same material. In some embodiments, a material of the first dielectric material layer 106 includes nitride such as silicon nitride, and a material of the second dielectric material layer 108 includes oxide such as silicon oxide. In some embodiments, a material of the third dielectric material layer 110 includes silicon nitride, and a material of the fourth dielectric material layer 112 includes silicon oxide, or silicon oxynitride. In some embodiments, the third dielectric material layer 110 and the fourth dielectric material layer 112 are patterned by a patterning process to provide openings 114a and openings 114b. In some embodiments, the patterning process involves photolithographic and etching processes using a mask (not shown).

Figure 2:
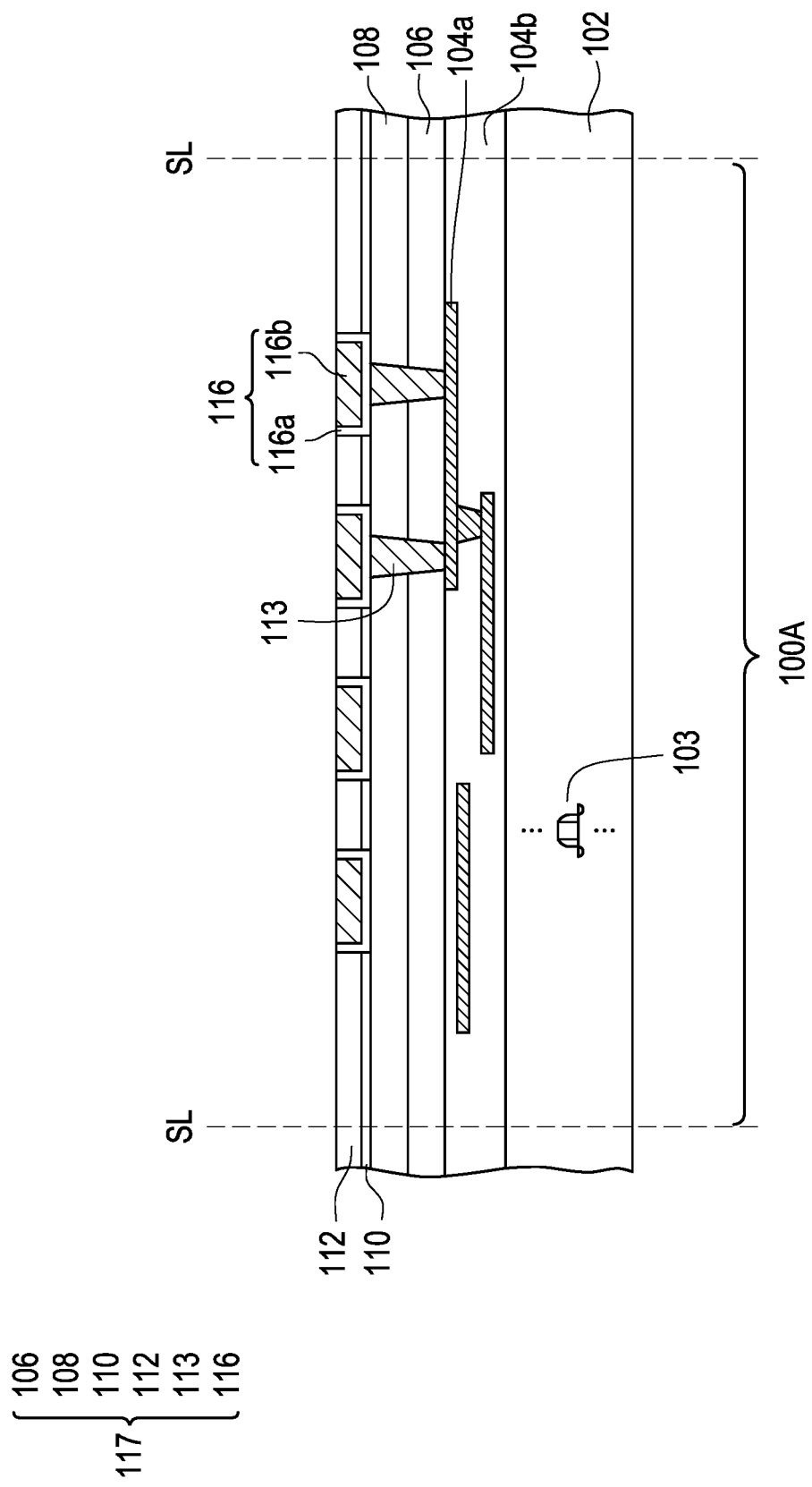

Referring to FIG. 2, in some embodiments, first pads 116 are formed in the openings 114a and the openings 114b. In some embodiments, each of the first pads 116 includes a liner layer 116a and a metallic pad 116b surrounded by the liner layer 116a. In some embodiments, a first bonding structure 117 including the stack of the first dielectric material layer 106, the second dielectric material layer 108, the third dielectric material layer 110 and the fourth dielectric material layer 112, the vias 113 and the first pads 116 is formed over the insulation layer 104b and the first metallization structures 104a. In some embodiments, the first pads 116 function as bonding pads, and the stack of dielectric material layers 106, 108, 110 and 112 (especially the fourth dielectric layer 112) functions as the bonding film for the first wafer 100 (e.g. first dies 100A). In some embodiments, some of the first pads 116 are electrically connected with the first metallization structures 104a through the vias 113, and may be further electrically connected with the semiconductor devices 103.

In some embodiments, the liner layer 116a includes a composite of a seed layer, a barrier layer and/or an adhesion layer, and the material of the liner layer 116a includes copper (Cu), titanium (Ti), titanium nitride (TiN), tantalum (Ta), tantalum nitride (TaN) or the like. In some embodiments, the liner layer 116a is formed by PVD, CVD, ALD or a combination thereof. In some embodiments, the metallic pad 116b are made of a metal or metallic material, such as copper (Cu), aluminum (Al), cobalt (Co), nickel (Ni), tungsten (W), alloys thereof, or combinations thereof. In some embodiments, the metallic pad 116b are formed by CVD or plating such as electro-chemical plating (ECP) or electroless plating.

Figure 3:
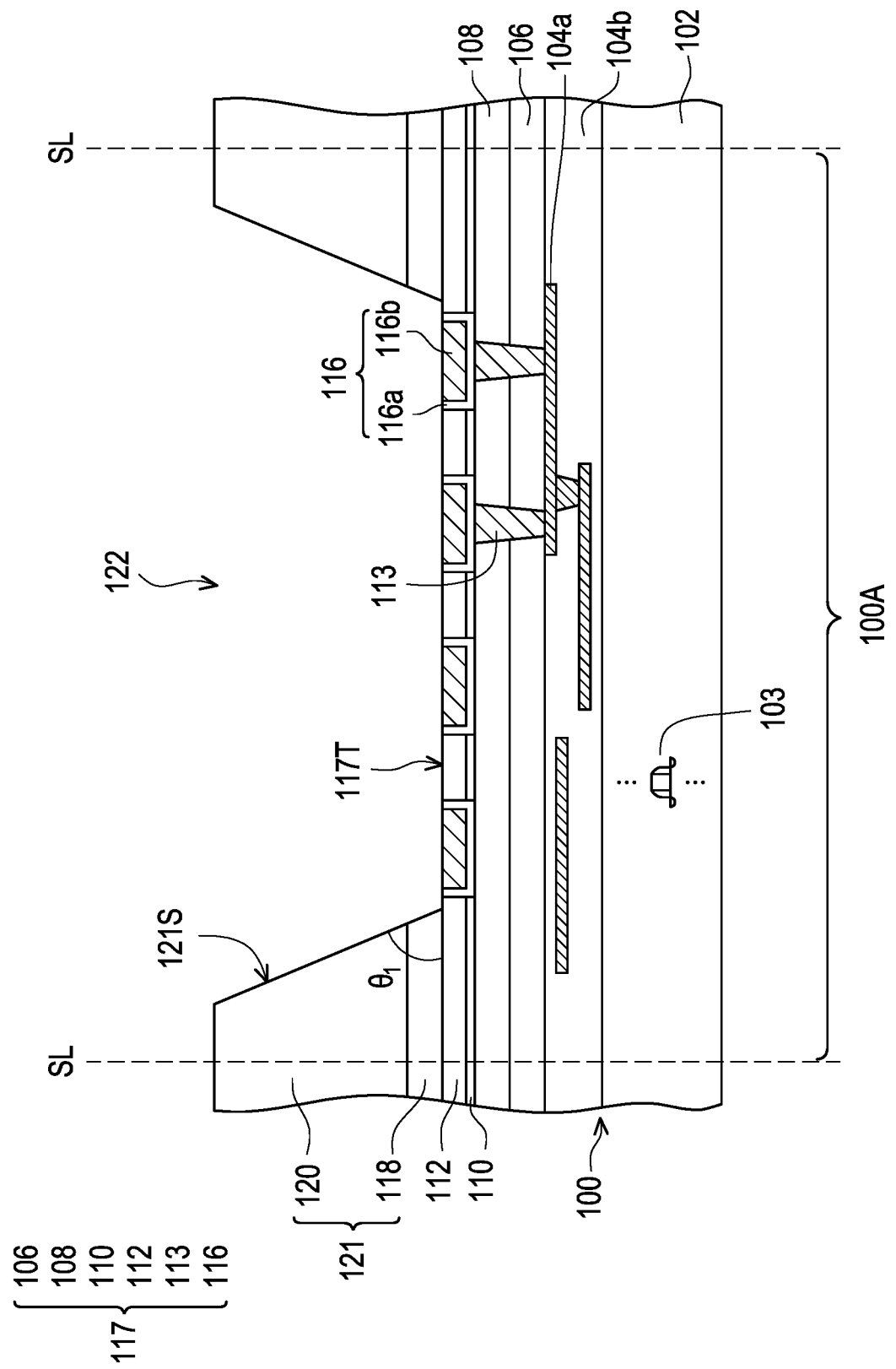

Referring to FIG. 3, in some embodiments, a smoothing layer 121 is formed on the first bonding structure 117 by sequentially forming a first dielectric layer 118 and a second dielectric layer 120 on the first bonding structure 117. In some embodiments, the first dielectric layer 118 and the second dielectric layer 120 are made of different dielectric materials. In some embodiments, a material of the first dielectric layer 118 includes nitride such as silicon nitride or aluminum nitride, carbide such as silicon carbide or nitricarbide such as silicon nitricarbide. In some embodiments, a material of the second dielectric layer 120 includes oxide such as silicon oxide or oxynitride such as silicon oxynitride.

In some embodiments, referring to FIG. 3, at least one cavity opening 122 is formed in the dielectric layers 118 and 120 through a patterning process. In some embodiments, the cavity opening 122 penetrates through the dielectric layers 118 and 120 to reveal the first pads 116 and to reveal a top surface 117T of the first bonding structure 117. In some embodiments, the smoothing layer 121 with the cavity opening 122 (i.e., the patterned dielectric layers 118 and 120) may be considered as a planarizing guard structure.

In some embodiments, as seen in FIG. 3, the cavity opening 122 (or the patterned smoothing layer 121) has slant sidewalls 121S, and there is an angle $\theta_1$ sandwiched between the sidewall 121S and the top surface 117T of the first bonding structure 117. In some embodiments, the angle $\theta_1$ is an acute angle smaller than 90 degrees. In some embodiments, the cavity opening 122 is formed by an anisotropic etching process such as a plasma etching process using gases such as argon (Ar) gas, nitrogen ($N_2$) gas, oxygen ($O_2$) gas, or a combination thereof.

Figure 4:
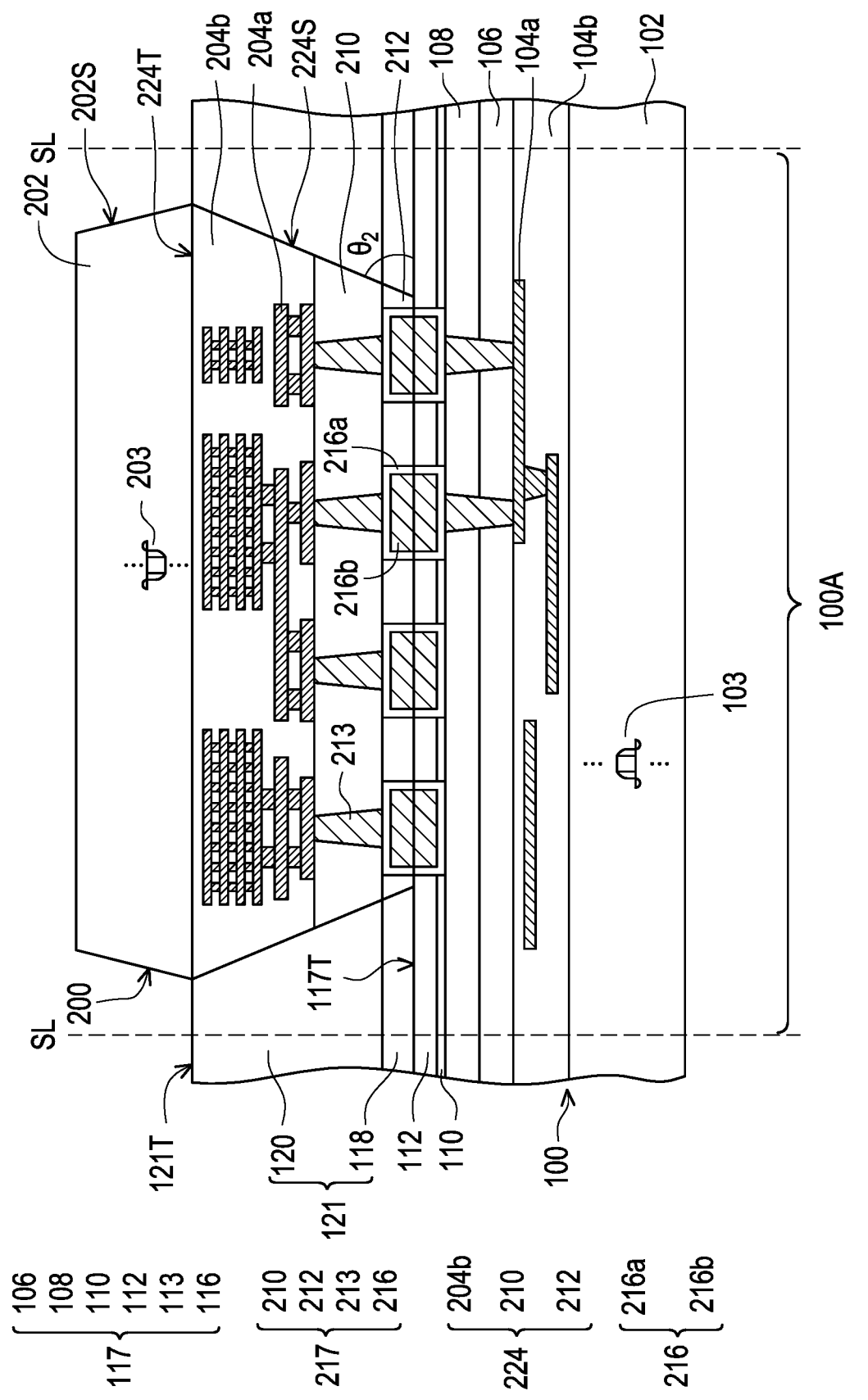

Referring to FIG. 4, in some embodiments, a second die 200 is placed into the cavity opening 122 and disposed on the revealed top surface 117T of the first bonding structure 117. In some embodiments, the second die 200 is bonded to the first wafer 100 (i.e. bonded with the first die 100A) through hybrid bonding technology. In some embodiments, the second die 200 may be placed through a pick-and-place process. In some embodiments, the second die 200 has a semiconductor substrate 202, semiconductor devices 203 formed in the semiconductor substrate 202 and second metallization structures 204a embedded within an insulation layer 204b formed on the semiconductor substrate 202. In some embodiments, the materials and formation methods of the semiconductor substrate 202, semiconductor devices 203, the second metallization structures 204a and the insulation layer 204b may be similar to those of the semiconductor substrate 102, the semiconductor devices 103, the first metallization structures 104a and the insulation layer 104b, and the details will not be repeated herein. In some embodiments, the second die 200 has a second bonding structure 217 including a stack of a dielectric material layer 210 and a dielectric material layer 212, vias 213 and second pads 216, and the second bonding structure 217 is formed over the insulation layer 204b and the second metallization structures 204a.

In some embodiments, the second die 200 is bonded to the wafer 100 through the bonding between the first and second pads 116 and 216 and the bonding between the dielectric material layers 212 and 112. That is, the second pads 216 function as bonding pads of the second die 200, and the stack of dielectric material layers 210, 212 (especially the dielectric material layer 212) functions as the bonding film for the second die 200. In some embodiments, some of the second pads 216 are electrically connected with the second metallization structures 204a through the vias 213, and may be further electrically connected with the semiconductor devices 203. In some embodiments, each of the second pads 216 includes a liner layer 216a and a metallic pad 216b surrounded by the liner layer 216a.

In some embodiments, a material of the dielectric material layer 210 may be selected from silicon oxide, silicon nitride, a low-k dielectric material or a combination thereof. In some embodiments, a material of the dielectric material layer 212 may be selected from silicon oxide, silicon nitride, silicon oxynitride, silicon carbide, a polymeric material or a combination thereof. The formation methods of the dielectric material layers 210 and 212 may be similar to those of the dielectric material layers 106, 108, 110, 112, and the details will not be repeated herein. In some embodiments, the materials of the dielectric material layer 210 and the dielectric material layer 212 are different. In some embodiments, a material of the dielectric material layer 210 includes a low-k dielectric material, silicon oxide or silicon nitride, and a material of the dielectric material layer 212 includes silicon oxide or silicon oxynitride. In some embodiments, the materials and formation methods of the second pads 216 (the liner layer 216a and the metallic pad 216b) may be similar to those of the first pads 116 (the liner layer 116a and the metallic pad 116b), and the details will not be repeated herein.

In some embodiments, as seen in FIG. 4, the smoothing layer 121 is disposed around the second die 200. In some embodiments, the insulation layer 204b, the dielectric material layers 210 and 212 are in contact with the smoothing layer 121 (i.e. the first dielectric layer 118 and the second dielectric layer 120), so that the second die 200 is fitted into the cavity opening 122 and laterally covered by the smoothing layer 121. In some embodiments, the smoothing layer 121 is thick enough to fully cover the insulation layer 204b, the dielectric material layers 210 and 212 of the second die 200. That is, the thickness (or height) of the smoothing layer is at least equivalent to or larger than the total thickness (or height) of the insulation layer 204b, the dielectric material layers 210 and 212.

In some embodiments, in FIG. 4, the insulation layer 204b and the dielectric material layers 210 and 212 together form a dielectric portion 224 of the second die 200, while the semiconductor substrate 202 is regarded as a semiconductor material portion of the second die 200. In some embodiments, the dielectric portion 224 is surrounded by the smoothing layer 121, and a top surface 224T of the dielectric portion 224 is substantially levelled with a top surface 121T of the smoothing layer 121. In some embodiments, measuring from the top surface 117T of the first bonding structure 117, a top surface 224T of the dielectric portion 224 is not higher than a top surface 121T of the smoothing layer 121.

As shown in FIG. 4, in some embodiments, the dielectric portion 224 has slant sidewalls 224S, and there is an angle $\theta_2$ sandwiched between the sidewall 224S and the top surface 117T of the first bonding structure 117. In some embodiments, the angle $\theta_2$ is an acute angle smaller than 90 degrees. In some embodiments, the angle $\theta_2$ is substantially equivalent to the angle $\theta_1$. In one embodiment, the second die 200 is tightly fitted into the cavity opening 122 without void between the dielectric portion 224 and the smoothing layer 121. As seen in FIG. 4, the semiconductor material portion 202 has slant sidewalls 202S, but the slope of the slant sidewalls 202S is different from the slope of the slant sidewalls 224S. In some embodiments, in FIG. 4, a bottom span of the semiconductor material portion 202 of the second die 200 is larger than a top span of the semiconductor material portion 202. On the other hand, as seen in FIG. 4, a top span of the dielectric portion 224 is larger than a bottom span of the dielectric portion 224.

Figure 5:
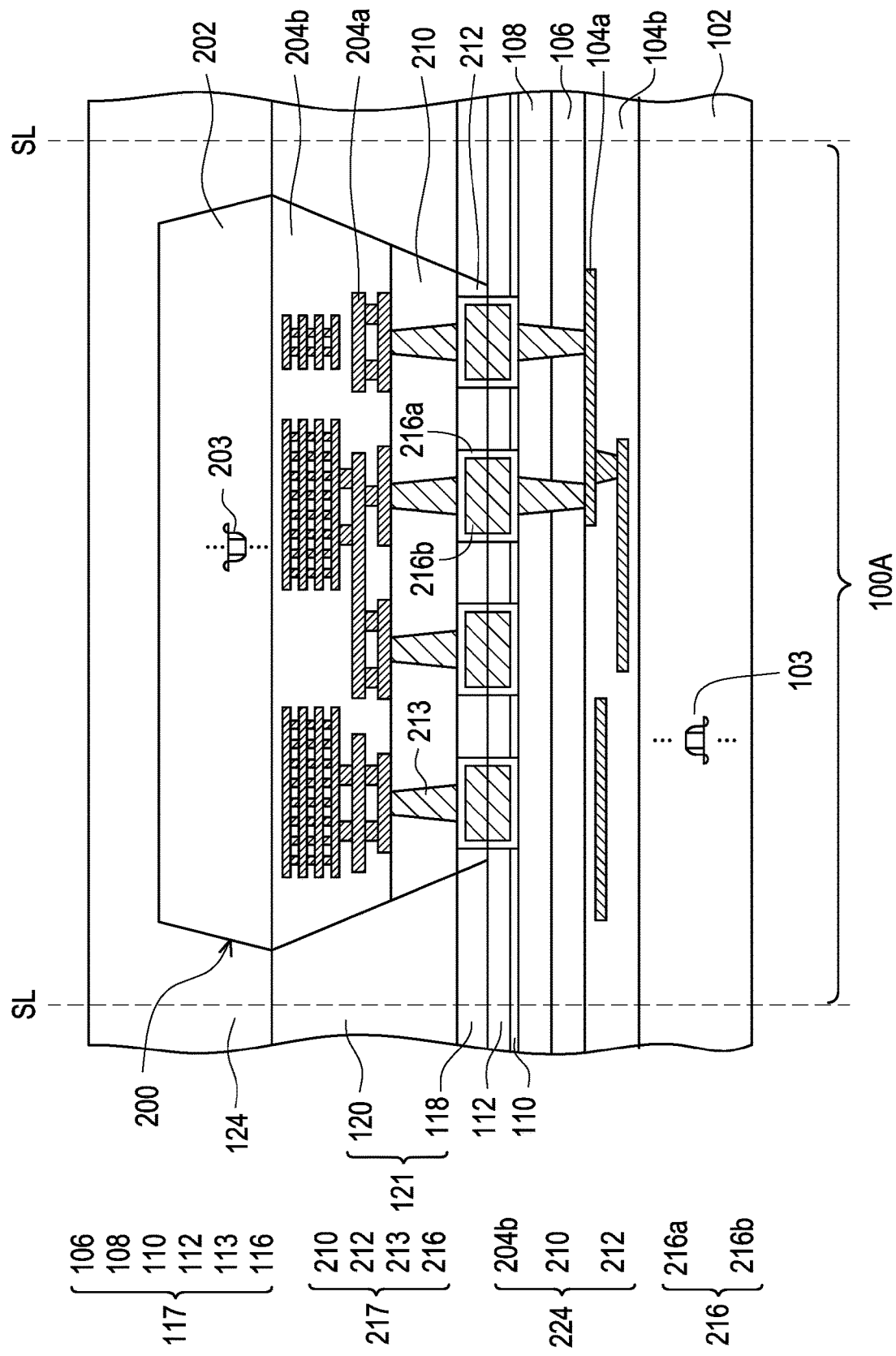

Referring to FIG. 5, in some embodiments, a filling material layer 124 is formed over the semiconductor substrate 102 to fully cover the semiconductor material portion (the semiconductor substrate 202) of the second die 200. In some embodiments, the filling material layer 124 is an insulating layer. In some embodiments, before the formation of the filling material layer 124, a surface plasma treatment process is performed to remove the dangling bonds of the surface(s) for assisting the subsequent formation or deposition of the filling material layer 124. Through such surface plasma treatment process, the interface between the smoothing layer 121 and the filling material layer 124 is cleaned and better adhesion is achieved. The smoothing layer 121 that covers the sidewalls 224S of the dielectric portion 224 functions as a planarizing guard structure, so that the surface plasma treatment is performed to the smoothing layer 121 and the stressful interface between the dielectric portion 224 and the semiconductor material portion 202 is sheltered by the smoothing layer 121. In one embodiment, the filling material layer 124 is formed by chemical vapor deposition (CVD). Alternatively, the filling material layer 124 may be formed by spin coating or molding. In some embodiments, the material of the filling material layer 124 includes silicon oxide ($SiO_x$), low-k dielectric materials, flowable oxide materials, PECVD TEOS, PECVD USG, HDP-CVD USG, SOG $SiO_x$, $O_3$-TEOS USG or other molding materials. In some embodiments, the materials of the filling material layer 124, the first dielectric layer 118 and the second dielectric layer 120 are different.

Figure 6:
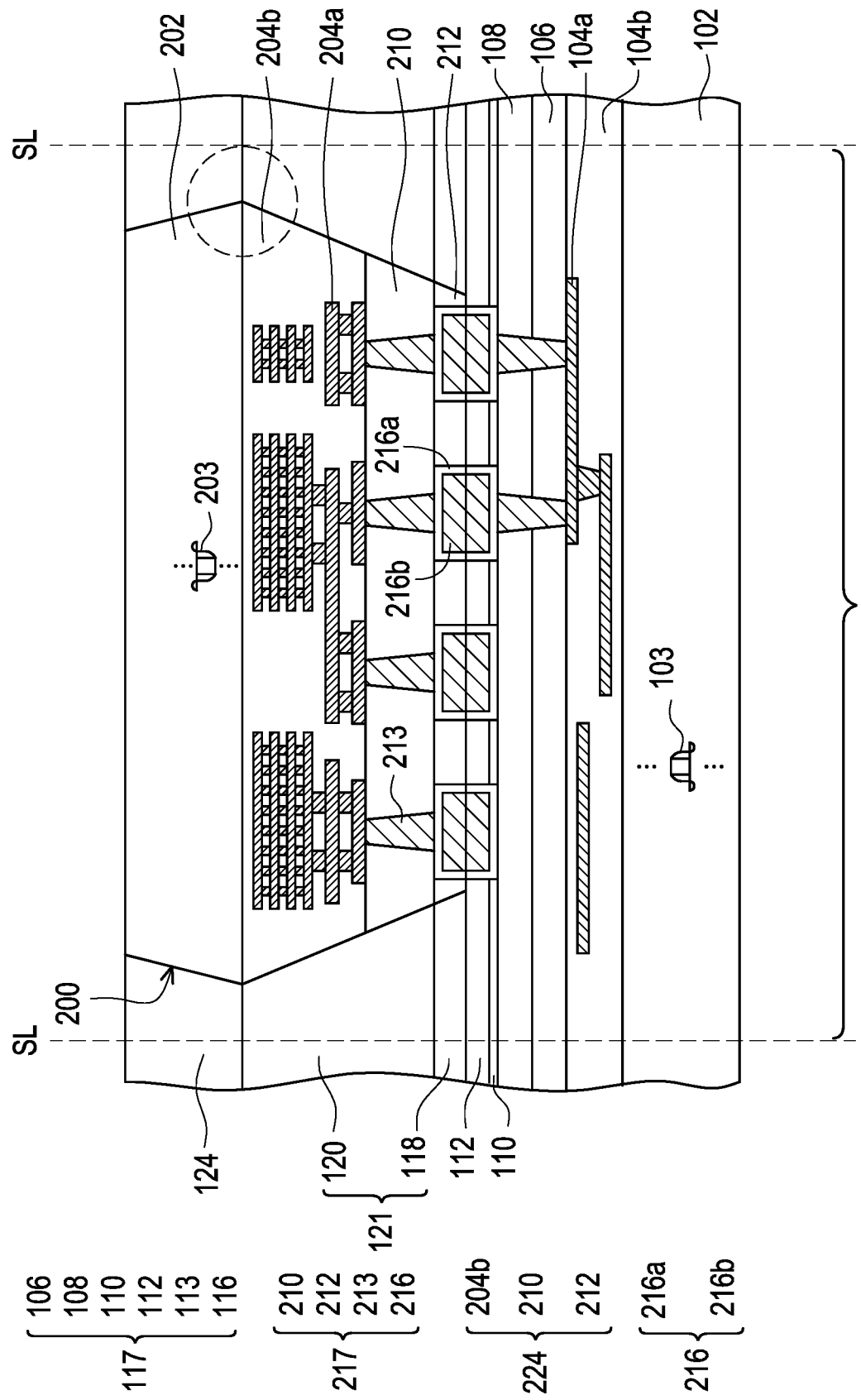

Referring to FIG. 6, in some embodiments, the filling material layer 124 is planarized. For example, the filling material layer 124 is partially removed to be levelled with and flush with the backside of the second die 200 by performing a grinding process or a polishing process (such as a chemical mechanical polishing process). In some embodiments, the filling material layer 124 is disposed around the second die 200. In some embodiments, the semiconductor material portion 202 of the second die 200 is surrounded and covered by the filling material layer 124 and is at least laterally wrapped by the filling material layer 124 after planarization.

Figure 6B:
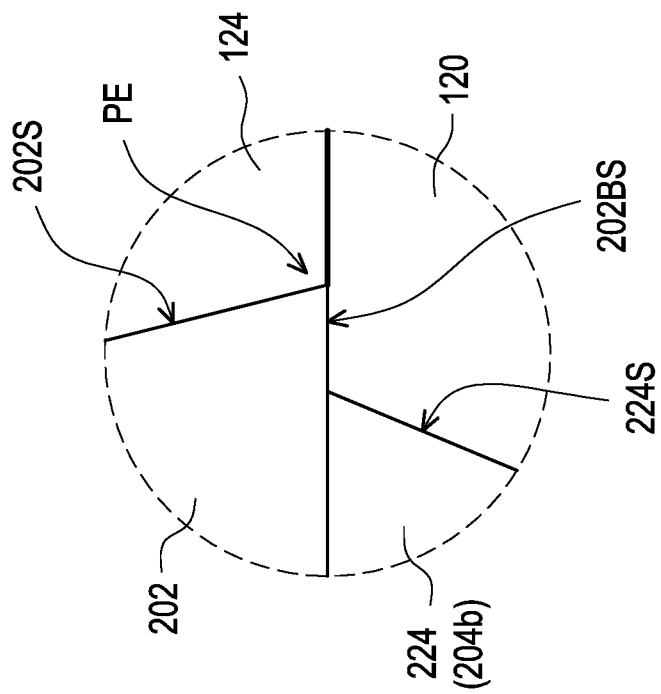
FIG. 6A and FIG. 6B are examples showing a partial enlarged view of the circled part of the structure in FIG. 6 in accordance with embodiments of the present disclosure.
Figure 6A:
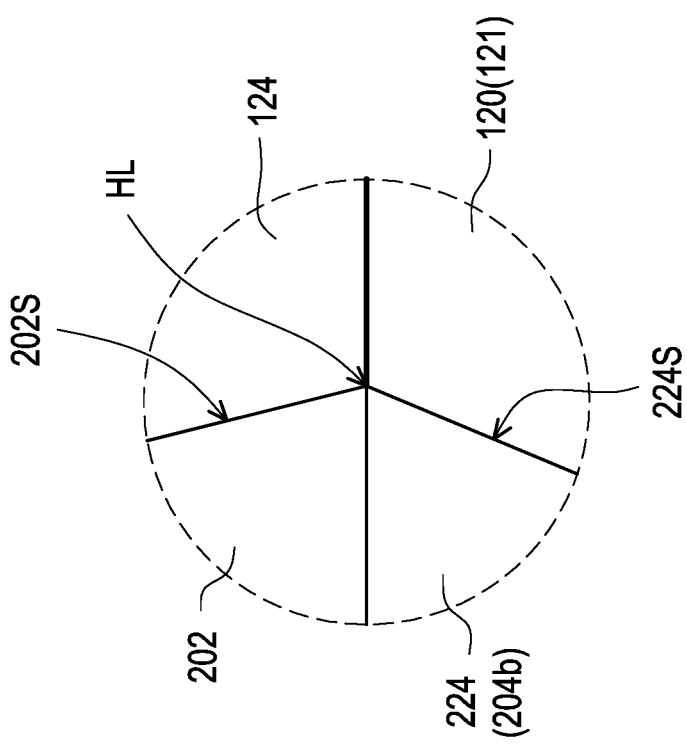

FIG. 6A and FIG. 6B are examples showing a partial enlarged view of the circled part of the structure in FIG. 6 in accordance with embodiments of the present disclosure. Referring to FIG. 6A, in some embodiments, the sidewall 224S of the dielectric portion 224 is connected with the sidewall 202S of the semiconductor material portion 202 with a hinge line HL there-between, so that an interface between the dielectric portion 224 and the semiconductor material portion 202 is covered by the smoothing layer 121, and the filling material layer 124 fully covers the sidewalls 202S of the semiconductor material portion 202. In some embodiments, the interface between the dielectric portion 224 and the semiconductor material portion 202 substantially flushes with (or slightly lower than) the interface between the filling material layer 124 and the second dielectric layer 120 of the smoothing layer 121. That is, the sidewalls 224S of the dielectric portion 224 are isolated from the filling material layer 124 by the smoothing layer 121. Due to the existence of the smoothing layer 121, a better film quality is achieved and better adhesion is obtained for the filling material layer 124.

Referring to FIG. 6B, in some embodiments, the semiconductor material portion 202 is laterally protruded from the sidewall 224S of the dielectric portion 224 to form a protruded edge PE. That is, the top span of the dielectric portion 224 is smaller than the bottom span of the semiconductor material portion 202, and a bottom surface 202BS of the semiconductor material portion 202 connects the sidewall 202S of the semiconductor material portion 202 and the sidewall 224S of the dielectric portion 224. In some embodiments, the retreated sidewall 224S is still fully covered by the smoothing layer 121, and a part of the semiconductor material portion 202 is in contact with and overlaps with the second dielectric layer 120. Since the second dielectric layer 120 of the smoothing layer 121 covers the protruded edge PE, a flatter profile is provided for the later formed filling material layer 124 and no or less crack(s) occurs during the formation of the filling material layer 124.

Figure 7:
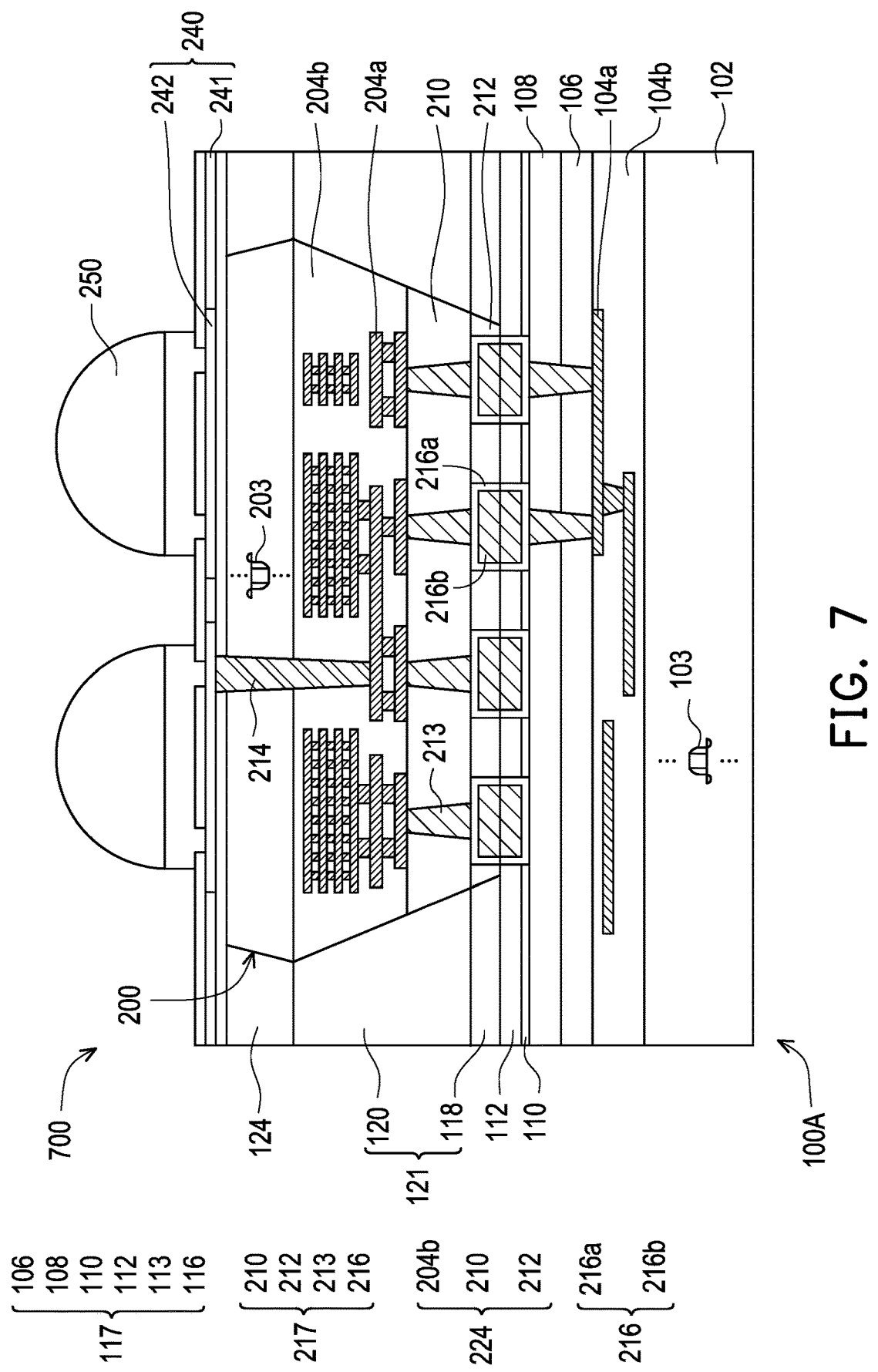

Referring to FIG. 7, in some embodiments, a redistribution layer (RDL) 240 is formed on the filling material layer 124 and over the semiconductor substrate 202 of the second die 200. For example, the redistribution layer (RDL) 240 is electrically connected with the second die 200 through at least one through semiconductor via (TSV) 214 of the second dies 200. In some embodiments, the RDL 240 includes redistribution patterns 242 embedded in a dielectric material layer 241. The configuration of the redistribution patterns is not limited by the disclosure, while the dielectric material layer may include more than one layers of dielectric materials. The redistribution patterns 242 includes routing patterns and pads, for example. In some embodiments, the dielectric material layer 241 exposes some of the underlying redistribution patterns 242, and conductive terminals 250 are formed on the exposed patterns 242. In some embodiments, the material of the dielectric material layer 241 includes low-k dielectric materials, benzocyclobutene (BCB), epoxy, polyimide (PI), or polybenzoxazole (PBO). In some embodiments, the conductive terminals 250 include ball grid copper pillar bumps, ball grid array (BGA) bumps, gold bumps, or solder balls. Also, the conductive terminals 250 may be electrically connected with the second die 200 (or semiconductor devices 203) and the first die 100A (or devices 103) through the RDL 240, the TSV 214, the metallization structures 204a, 104a, the first and second bonding structures 217, 117, and the vias 213, 113.

Later, in some embodiments, a singulation process is performed to cut the first wafer 100 along the scribe lanes SL into individual stack structures. In some embodiments, the singulation process includes a wafer dicing process or a sawing process. After singulation, the stack structure 700 includes at least the first die 100A, the second die 200 disposed on the first die 100A, the smoothing layer 121 and the filling material layer 124 wrapping around the second die 200 and the RDL 240.

Figure 8:
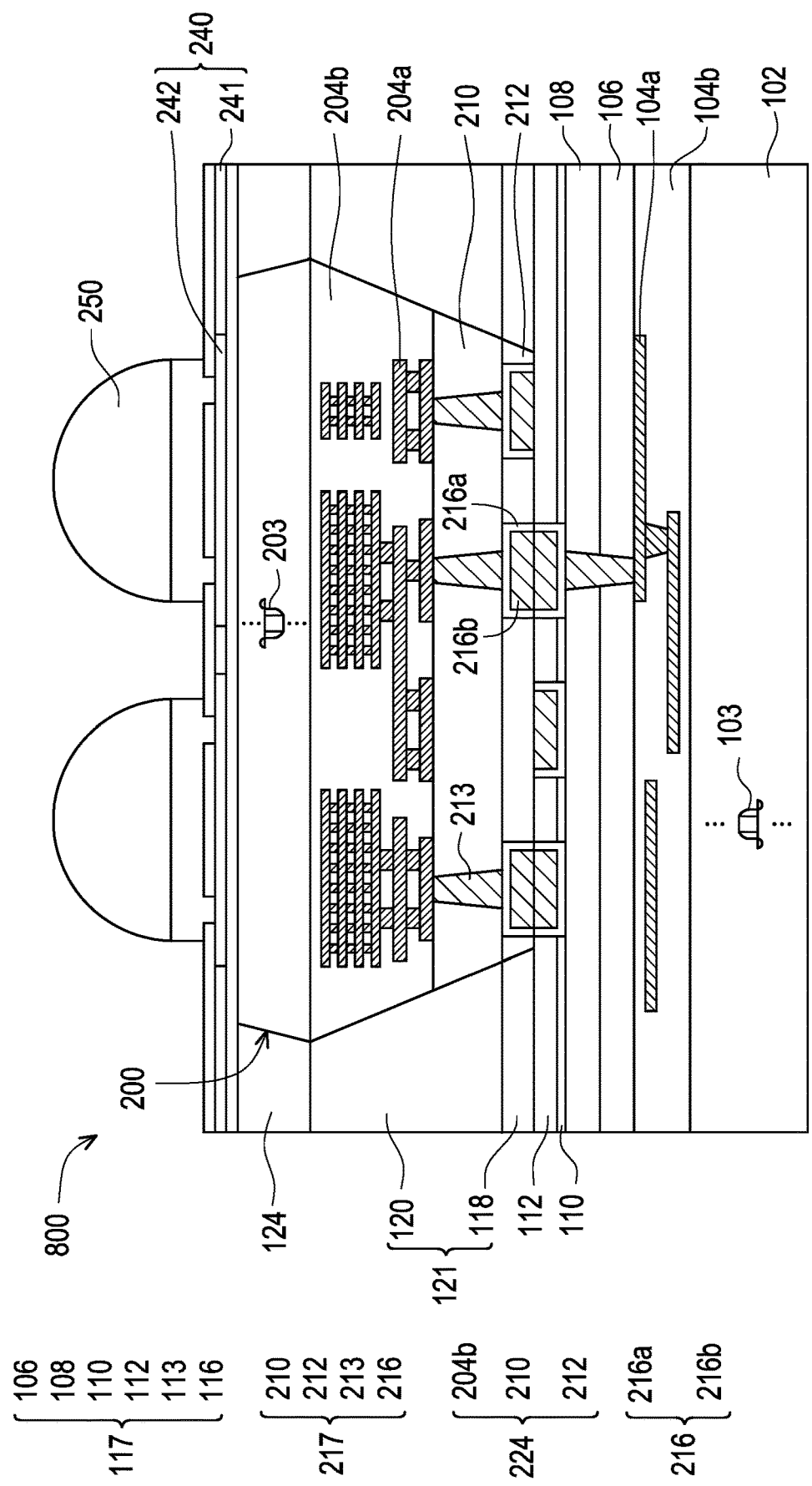
FIG. 8 is a cross-sectional view schematically illustrating a semiconductor structure in accordance with other embodiments of the present disclosure.

FIG. 8 is a cross-sectional view schematically illustrating a semiconductor structure in accordance with other embodiments of the present disclosure.

Referring to FIG. 8, in some embodiments, it is not necessary that every first pads 116 is bonded to one of the second pads 216, and vice versa. In the stack structure 800, first pads 116 may be bonded to second pads 216 or in contact with the dielectric material layer 212 functioning as the bonding film of the second die 200. Meanwhile, second pads 216 may be bonded to first pads 116 or in contact with the fourth dielectric material layer 112 functioning as the bonding film of the first die 100A.

Figure 9:
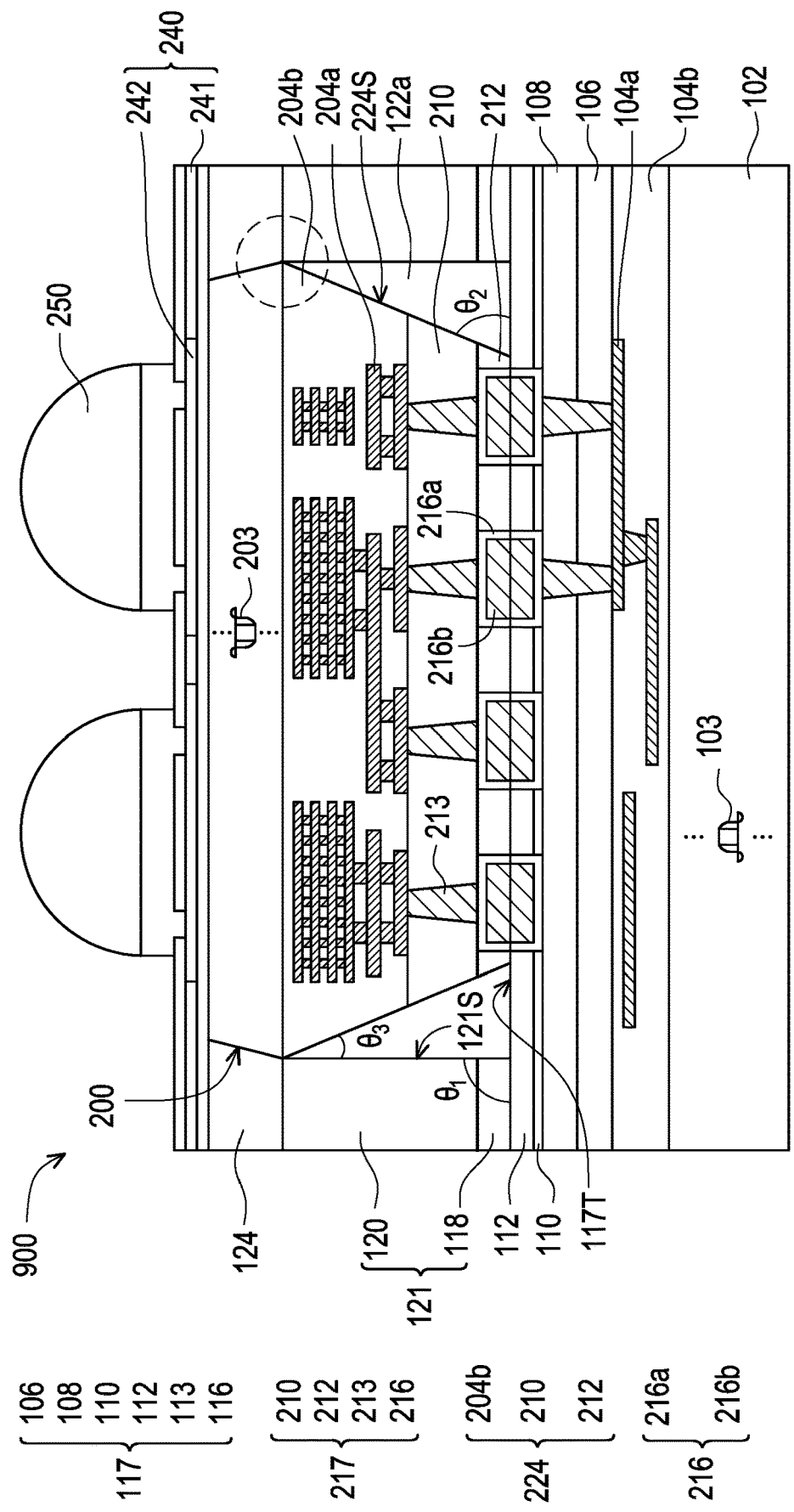
FIG. 9 is a cross-sectional view schematically illustrating a semiconductor structure in accordance with other embodiments of the present disclosure.

FIG. 9 is a cross-sectional view schematically illustrating a semiconductor structure in accordance with other embodiments of the present disclosure.

Referring to FIG. 9, in some embodiments, the second die 200 is not tightly fitted into the cavity opening 122, and there is a void between the dielectric portion 224 and the smoothing layer 121. However, once the second die 200 fitted into the cavity opening 122 seals the cavity opening 122, and no filling material is filled into the cavity opening during the formation of the filling material layer 124. In one embodiment, the angle $\theta_2$ is smaller than the angle $\theta_1$ in the stack structure 900. In FIG. 9, it is understood that the sidewalls 121S of the cavity opening 122 are merely substantially vertical sidewalls, and the angle $\theta_1$ may be about 90 degrees (plus or minus 2-3 degrees). In some embodiments, there is an angle $\theta_3$ sandwiched between the sidewall 121S of the smoothing layer 121 and the sidewall 224S of the dielectric portion 224. In some embodiments, the angle $\theta_3$ is equivalent to or smaller than a complement of $\theta_2$ sandwiched between the sidewall 224S and the top surface 117T of the first bonding structure 117. In some embodiments, the angle $\theta_3$ is smaller than a complement of the angle $\theta_2$ and the cavity opening 122 has a volume larger than a volume of the dielectric portion 224, so that there is an air gap 122a between the dielectric portion 224 and the sidewalls 121S of the smoothing layer 121. The air gap 122a surrounds the dielectric portion 224 of the second die 200, so that at least a portion of the dielectric portion 224 (i.e. the dielectric material layers 210, 212) is not in contact with the sidewalls 121S of the smoothing layer 121. Since the cavity opening 122 has a volume larger than a volume of the dielectric portion 224, the process window is widened, and the reliability of the device is accordingly improved.

Figure 9A:
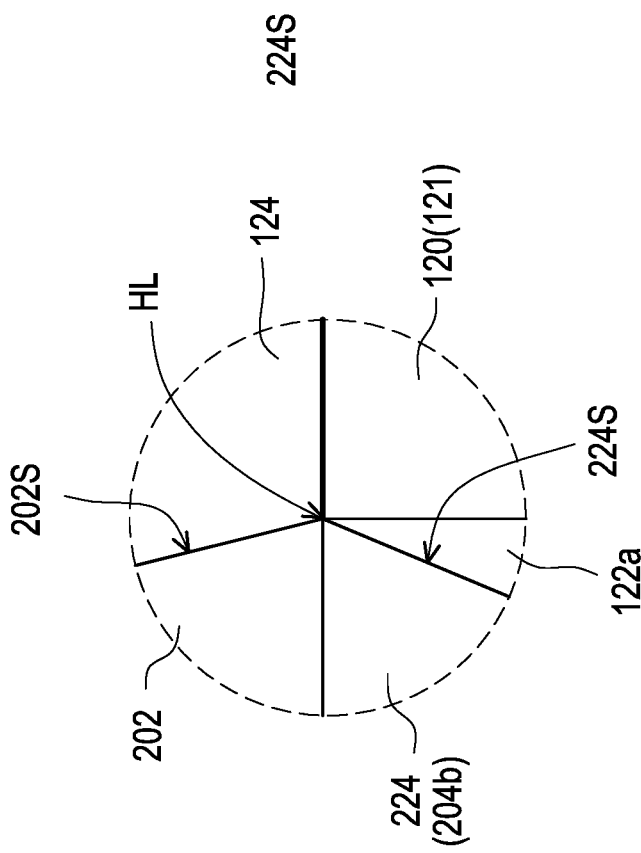
FIG. 9A and FIG. 9B are examples showing a partial enlarged view of the circled part of the structure in FIG. 9 in accordance with embodiments of the present disclosure.
Figure 9B:
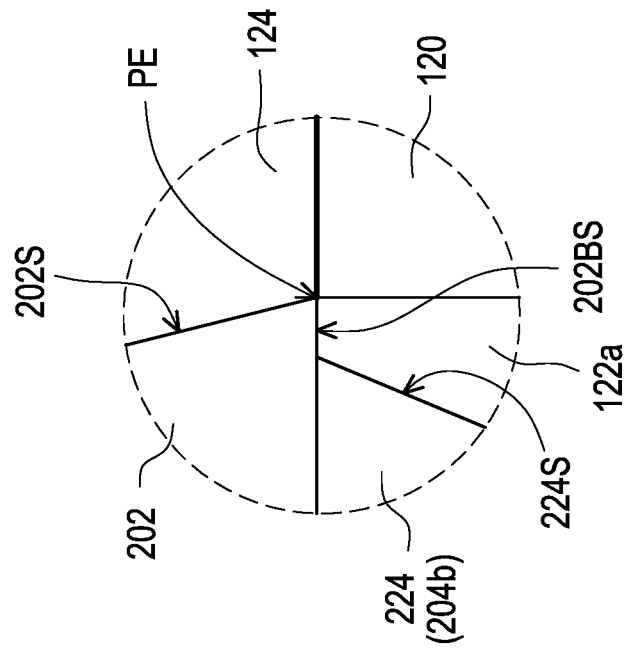

FIG. 9A and FIG. 9B are examples showing a partial enlarged view of the circled part of the structure in FIG. 9 in accordance with embodiments of the present disclosure.

Referring to FIG. 9A, in some embodiments, the circled part of the structure in FIG. 9 has a configuration similar to that shown in FIG. 6A, except that the air gap 122a surrounds the dielectric portion 224 of the second die 200. As shown in FIG. 9A, an interface between the dielectric portion 224 and the semiconductor substrate 202 is covered by the smoothing layer 121, and the filling material layer 124 fully covers the sidewalls 202S of the semiconductor material portion 202. In some embodiments, the sidewalls 224S of the dielectric portion 224 are isolated from the filling material layer 124 by the smoothing layer 121. Due to the existence of the smoothing layer 121, a better film quality is achieved and better adhesion is obtained for the filling material layer 124. In addition, due to the existence of the air gap 122a, the process window is widened, and the reliability of the device is accordingly improved.

Referring to FIG. 9B, in some embodiments, the circled part of the structure in FIG. 9 has a configuration similar to that shown in FIG. 6B, except that the air gap 122a surrounds the dielectric portion 224 of the second die 200. In some embodiments, the retreated sidewall 224S is not covered by the smoothing layer 121, and a part of the semiconductor material portion 202 overlaps with the air gap 122a. Since the second dielectric layer 120 of the smoothing layer 121 covers the protruded edge PE, a flatter profile is provided for the later formed filling material layer 124 and no or less crack(s) occurs during the formation of the filling material layer 124. In addition, due to the existence of the air gap 122a, the process window is widened, and the reliability of the device is accordingly improved.

Figure 10:
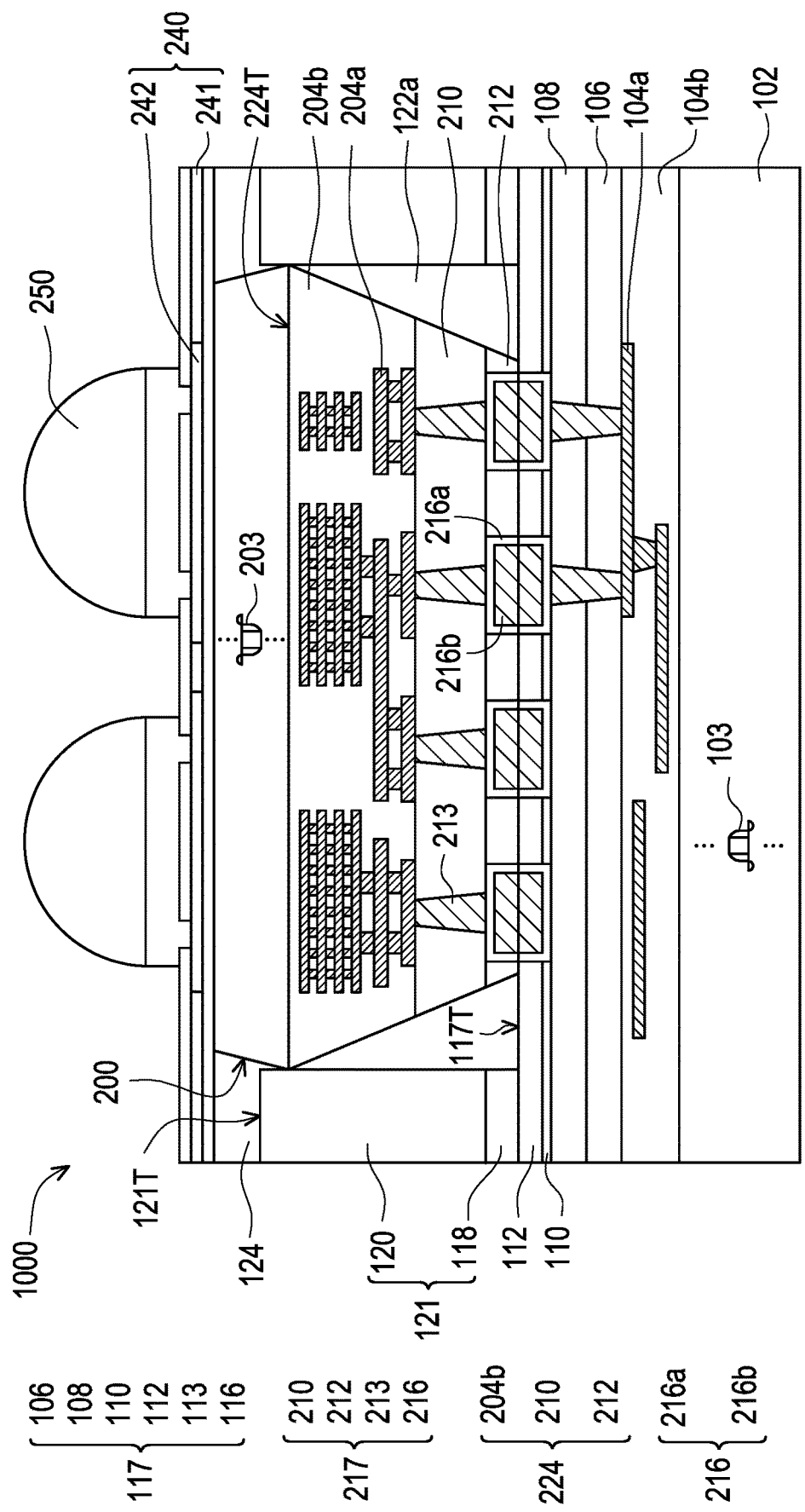
FIG. 10 is a cross-sectional view schematically illustrating a semiconductor structure in accordance with other embodiments of the present disclosure.

FIG. 10 is a cross-sectional view schematically illustrating a semiconductor structure in accordance with other embodiments of the present disclosure.

Referring to FIG. 10, in some embodiments, measuring from the top surface 117T, the top surface 224T of the dielectric portion 224 is lower than the top surface 121T of the smoothing layer 121 in the stack structure 1000.

Figure 10B:
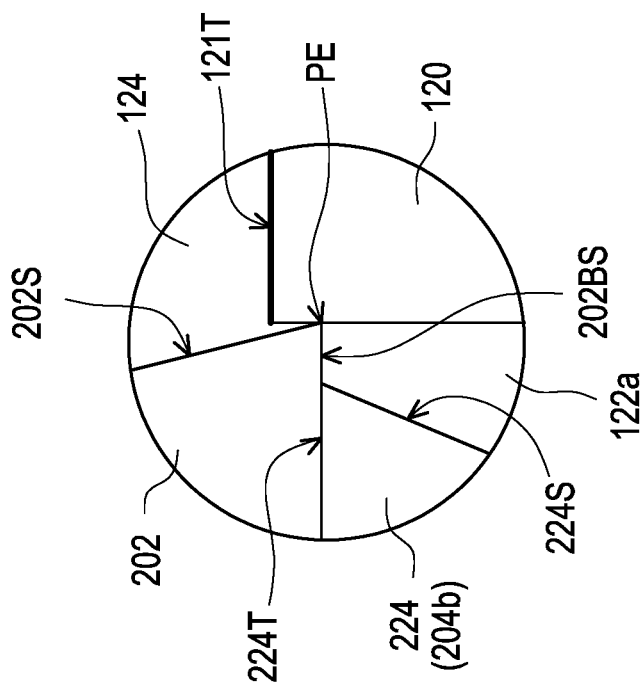
FIG. 10A and FIG. 10B are examples showing a partial enlarged view of the circled part of the structure in FIG. 10 in accordance with embodiments of the present disclosure.
Figure 10A:
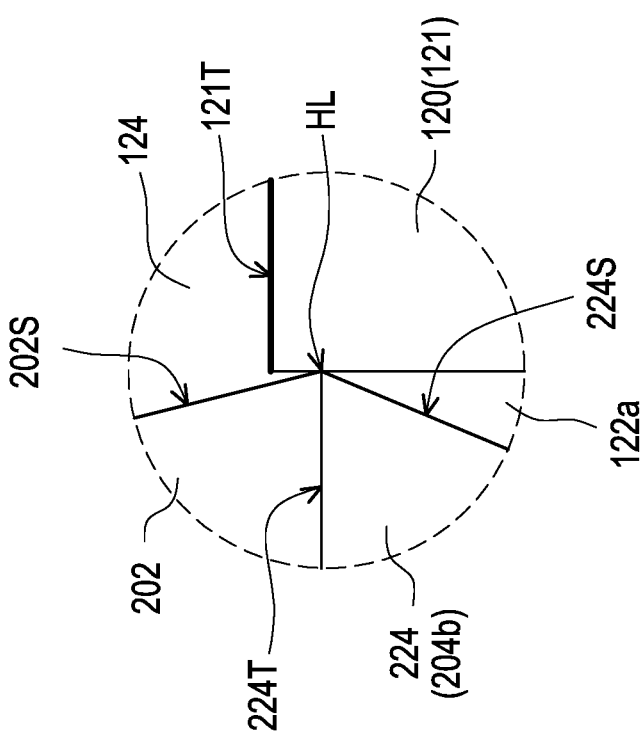

FIG. 10A and FIG. 10B are examples showing a partial enlarged view of the circled part of the structure in FIG. 10 in accordance with embodiments of the present disclosure.

Referring to FIG. 10A, in some embodiments, the circled part of the structure in FIG. 10 has a configuration similar to that shown in FIG. 9A, except that top surface 224T of the dielectric portion 224 is lower than the top surface 121T of the smoothing layer 121. As shown in FIG. 10A, in some embodiments, the filling material layer 124 fills into the space between the semiconductor substrate 202 and the second dielectric layer 120, and the filling material layer 124 fully covers the sidewalls 202S of the semiconductor material portion 202. Due to the existence of the smoothing layer 121, a better film quality is achieved and better adhesion is obtained for the filling material layer 124. In addition, due to the existence of the air gap 122a, the process window is widened, and the reliability of the device is accordingly improved.

Referring to FIG. 10B, in some embodiments, the circled part of the structure in FIG. 10 has a configuration similar to that shown in FIG. 9B, except that that top surface 224T of the dielectric portion 224 is lower than the top surface 121T of the smoothing layer 121. As shown in FIG. 10A in some embodiments, the filling material layer 124 fills into the space between the semiconductor substrate 202, and the filling material layer 124 fully covers the sidewalls 202S of the semiconductor material portion 202. Since the second dielectric layer 120 of the smoothing layer 121 covers the protruded edge PE, a flatter profile is provided for the later formed filling material layer 124 and no or less crack(s) occurs during the formation of the filling material layer 124. In addition, due to the existence of the air gap 122a, the process window is widened, and the reliability of the device is accordingly improved.

Figure 11:
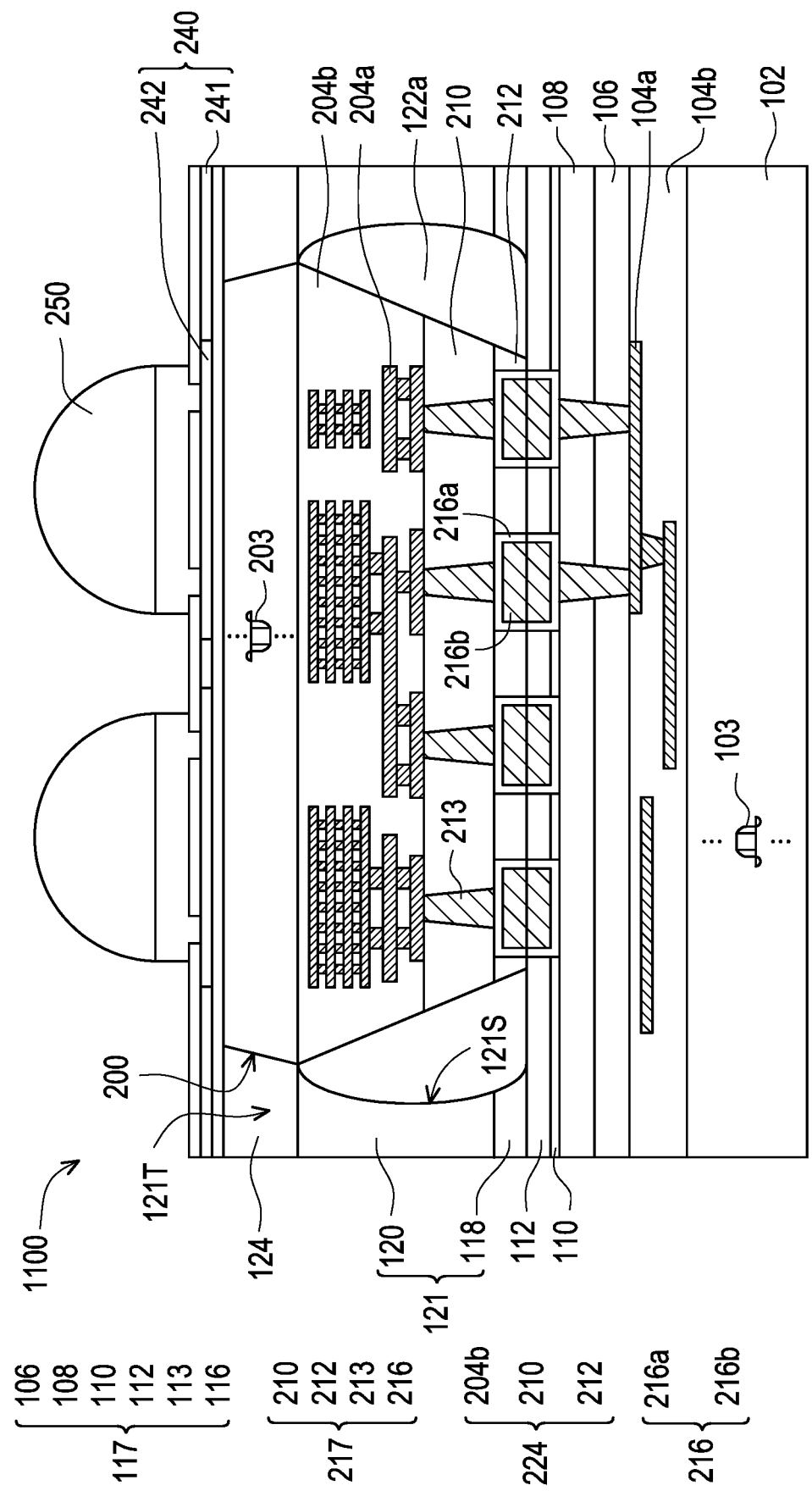
FIG. 11 is a cross-sectional view schematically illustrating a semiconductor structure in accordance with other embodiments of the present disclosure.

FIG. 11 is a cross-sectional view schematically illustrating a semiconductor structure in accordance with other embodiments of the present disclosure.

Referring to FIG. 11, in some embodiments, the smoothing layer 121 has curved bowl-shaped sidewalls 121S surrounding the dielectric portion 224 of the second die 200 in the stack structure 1100.

Figure 12:
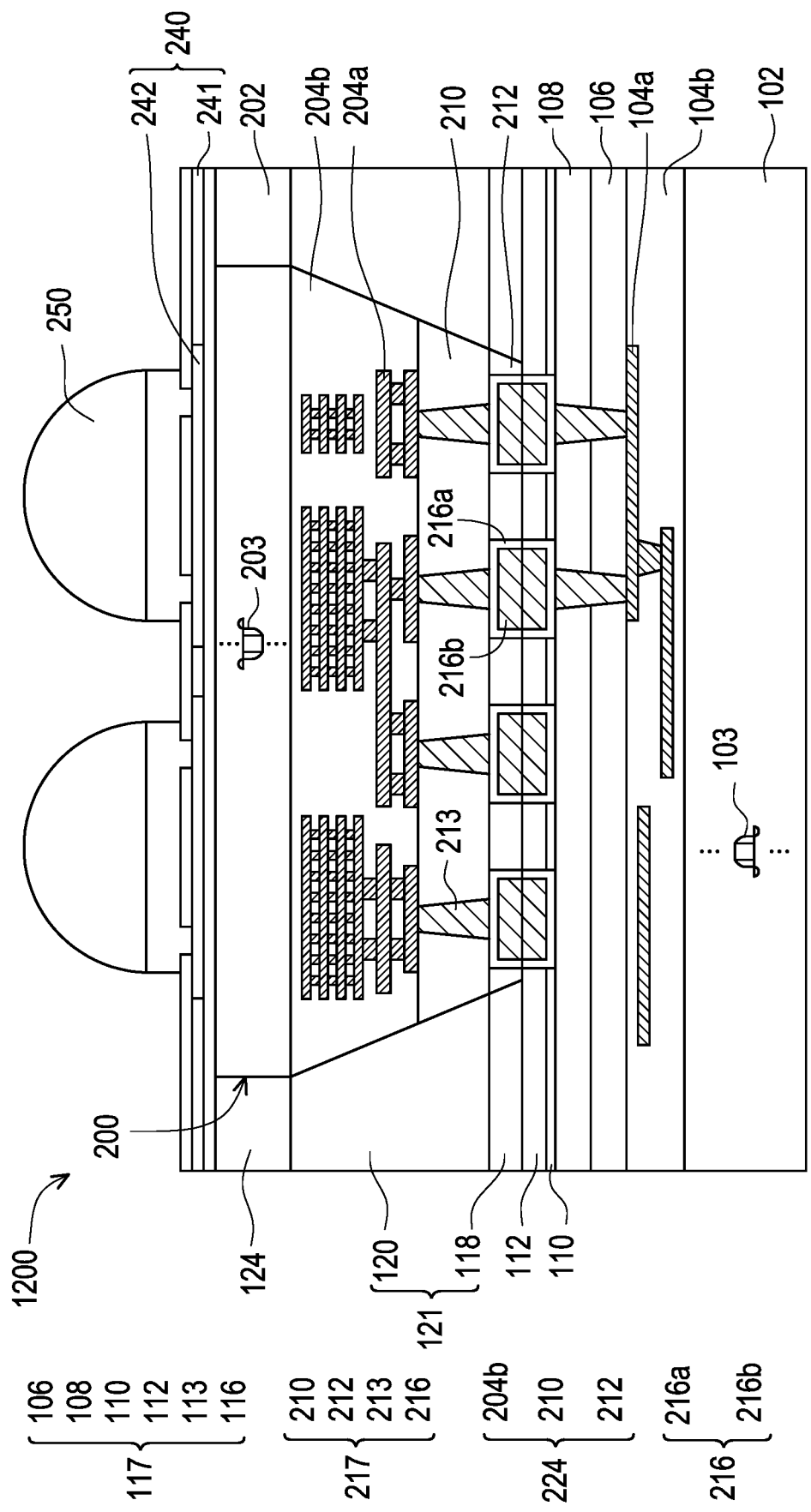
FIG. 12 is a cross-sectional view schematically illustrating a semiconductor structure in accordance with other embodiments of the present disclosure.

FIG. 12 is a cross-sectional view schematically illustrating a semiconductor structure in accordance with other embodiments of the present disclosure.

Referring to FIG. 12, in some embodiments, the bottom span of the semiconductor material portion 202 of the second die 200 is equivalent to the top span of the semiconductor material portion 202, so that the semiconductor material portion 202 of the second die 200 has a substantially vertical sidewall in the stack structure 1200.

Figure 13:
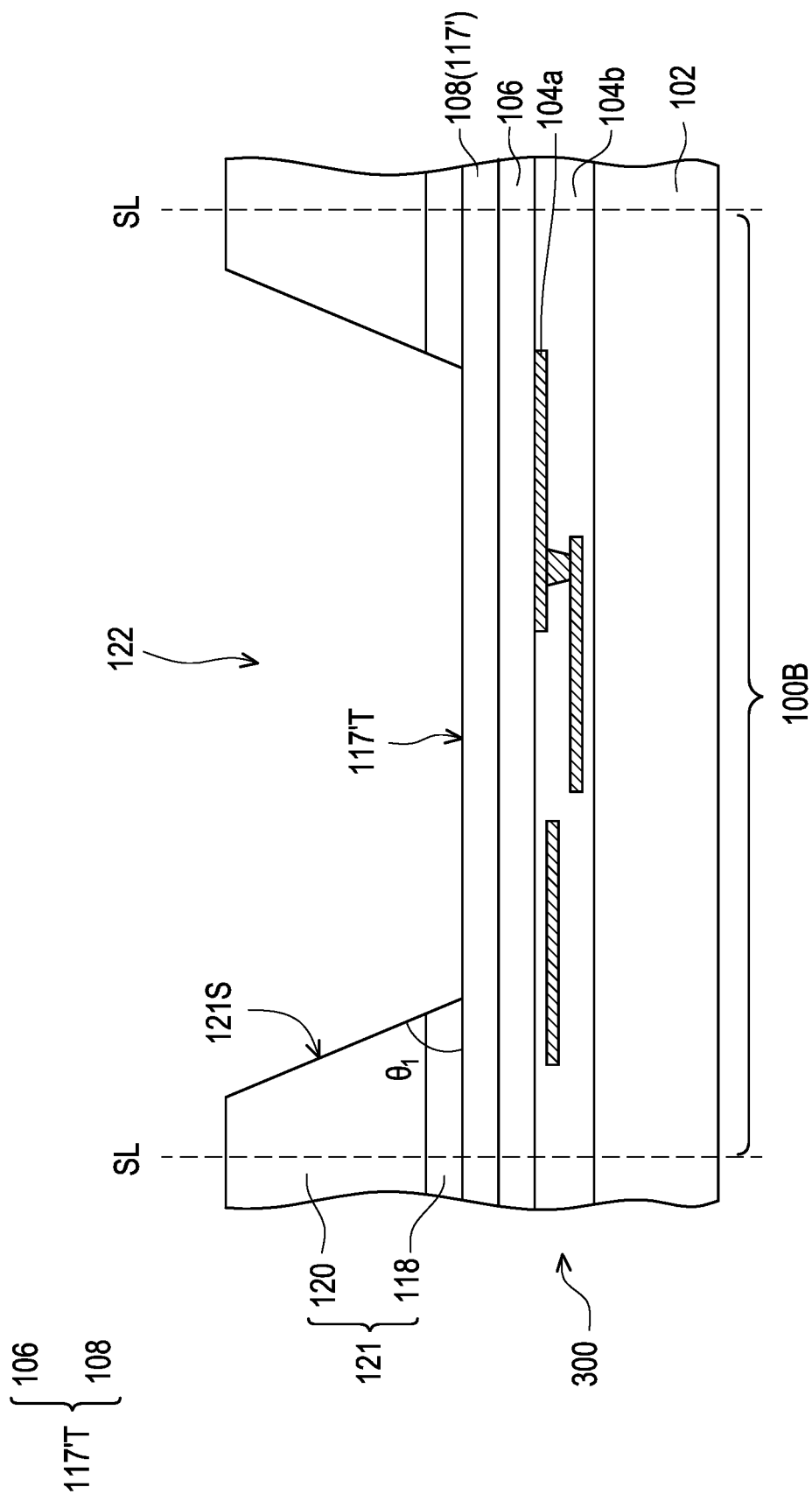
FIG. 13 and FIG. 14 are cross-sectional views schematically illustrating various stages of a process for fabricating a semiconductor structure in accordance with some embodiments of the present disclosure.
Figure 14:
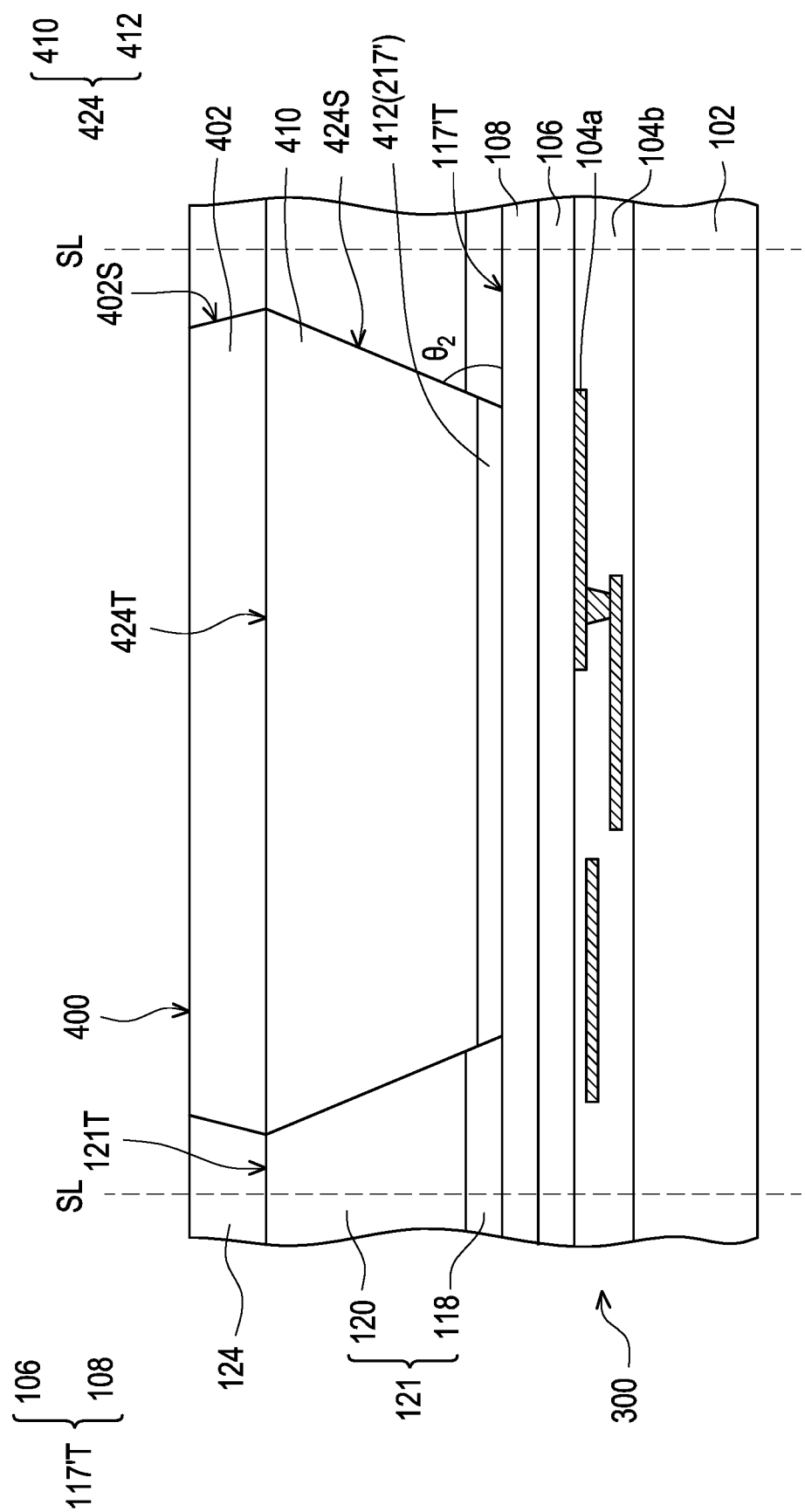

FIG. 13 and FIG. 14 are cross-sectional views schematically illustrating various stages of a process for fabricating a semiconductor structure in accordance with some embodiments of the present disclosure.

Referring to FIG. 13, in some embodiments, a first wafer 300 is provided, and the first wafer 300 includes the semiconductor substrate 102 and the first metallization structures 104a embedded within the insulation layer 104b formed on the semiconductor substrate 102. In some embodiments, the first wafer 300 may be considered to have a plurality of first dies 100B before dicing or singulation (one die unit is shown in FIG. 13). It is understood that the number of the first dies 100B is merely exemplary, and the first dies 100B may be the same type of dies or dies of the same functions. In some embodiments, the materials and formation methods of the semiconductor substrate 102, the first metallization structures 104a and the insulation layer 104b may be similar to those previously described, and the details will not be repeated herein.

In some embodiments, the first dielectric material layer 106 and the second dielectric material layer 108 are sequentially formed on the insulation layer 104b. In some embodiments, the materials and formation methods of the first dielectric material layer 106 and the second dielectric material layer 108 may be similar to those previously described, and the details will not be repeated herein. In some embodiments, a first bonding structure 117' including the stack of the first dielectric material layer 106 and the second dielectric material layer 108 is formed over the insulation layer 104b and the first metallization structures 104a. In some embodiments, the stack of dielectric material layers 106 and 108 (especially the second dielectric material layer 108) functions as the bonding film for the first wafer 300 (e.g. first dies 100B). That is, the first bonding structure 117' does not include metallic pads.

In some embodiments, the smoothing layer 121 is formed on the first bonding structure 117' by sequentially forming the first dielectric layer 118 and the second dielectric layer 120 on the first bonding structure 117'. In some embodiments, the materials and formation methods of the first dielectric layer 118 and the second dielectric layer 120 may be similar to those previously described, and the details will not be repeated herein.

In some embodiments, at least one cavity opening 122 is formed in the dielectric layers 118 and 120 through a patterning process. In some embodiments, the cavity opening 122 penetrates through the dielectric layers 118 and 120 to reveal a top surface 117'T of the first bonding structure 117'. In some embodiments, the smoothing layer 121 with the cavity opening 122 (i.e., the patterned dielectric layers 118 and 120) may be considered as a planarizing guard structure.

In some embodiments, as seen in FIG. 13, the cavity opening 122 (or the patterned smoothing layer 121 has slant sidewalls 121S, and there is an angle $\theta_1$ sandwiched between the sidewall 121S and the top surface 117'T of the first bonding structure 117'. In some embodiments, the angle $\theta_1$ is an acute angle smaller than 90 degrees. In some embodiments, the formation methods of the cavity opening 122 may be similar to those previously described, and the details will not be repeated herein.

Referring to FIG. 14, in some embodiments, a second die 400 is placed into the cavity opening 122 and disposed on the revealed top surface 117'T of the first bonding structure 117'. In some embodiments, the second die 400 is bonded to the first wafer 300 (i.e. bonded with the first die 100B) through fusion bonding technology. In some embodiments, the second die 400 may be placed through a pick-and-place process. In some embodiments, the second die 400 has a semiconductor substrate 402, a dielectric material layer 410 and a dielectric material layer 412. In some embodiments, the materials and formation methods of the semiconductor substrate 402 may be similar to those of the semiconductor substrate 202, and the details will not be repeated herein. In some embodiments, the materials and formation methods of the dielectric material layer 410 and the dielectric material layer 412 may be similar to those of the dielectric material layer 210 and the dielectric material layer 212, respectively, and the details will not be repeated herein. In some embodiments, the materials of the dielectric material layer 410 and the dielectric material layer 412 are different. In some embodiments, a material of the dielectric material layer 410 includes a low-k dielectric material, silicon oxide or silicon nitride, and a material of the dielectric material layer 412 includes oxide or silicon oxynitride. In some embodiments, the second die 400 has a second bonding structure 217' including the dielectric material layer 412. That is, the second bonding structure 217' does not include metallic pads. In some embodiments, the second die 400 is bonded to the wafer 300 through the bonding between the dielectric material layers 412 and 108. That is, the dielectric material layer 412 functions as the bonding film of the second die 400.

In some embodiments, the dielectric material layer 410 and the dielectric material layer 412 together form a dielectric portion 424 of the second die 400, while the semiconductor substrate 402 is regarded as a semiconductor material portion of the second die 400. In some embodiments, the dielectric portion 424 is surrounded by the smoothing layer 121, and a top surface 424T of the dielectric portion 424 is substantially levelled with a top surface 121T of the smoothing layer 121. In some embodiments, measuring from the top surface 117'T, a top surface 424T of the dielectric portion 424 is not higher than a top surface 121T of the smoothing layer 121.

As shown in FIG. 14, in some embodiments, the dielectric portion 424 has slant sidewalls 424S, and there is an angle $\theta_2$ sandwiched between the sidewall 424S and the top surface 117'T of the first bonding structure 117'. In some embodiments, the angle $\theta_2$ is an acute angle smaller than 90 degrees. In some embodiments, the angle $\theta_2$ is substantially equivalent to the angle $\theta_1$. In one embodiment, the second die 400 is tightly fitted into the cavity opening 122 without void between the dielectric portion 424 and the smoothing layer 121. As seen in FIG. 14, the semiconductor material portion 402 has slant sidewalls 402S, but the slope of the slant sidewalls 402S is different from the slope of the slant sidewalls 424S. In some embodiments, in FIG. 14, a bottom span of the semiconductor material portion 402 of the second die 400 is larger than a top span of the semiconductor material portion 402. On the other hand, as seen in FIG. 14, a top span of the dielectric portion 424 is larger than a bottom span of the dielectric portion 424.

In some embodiments, a filling material layer 124 is formed over the semiconductor substrate 102 to fully cover the semiconductor material portion (the semiconductor substrate 402) of the second die 400. In some embodiments, the materials and formation methods of the filling material layer 124 may be similar to those previously described, and the details will not be repeated herein. In some embodiments, the semiconductor material portion 402 of the second die 400 is surrounded by the filling material layer 124 and is at least laterally wrapped by the filling material layer 124.

Figure 15:
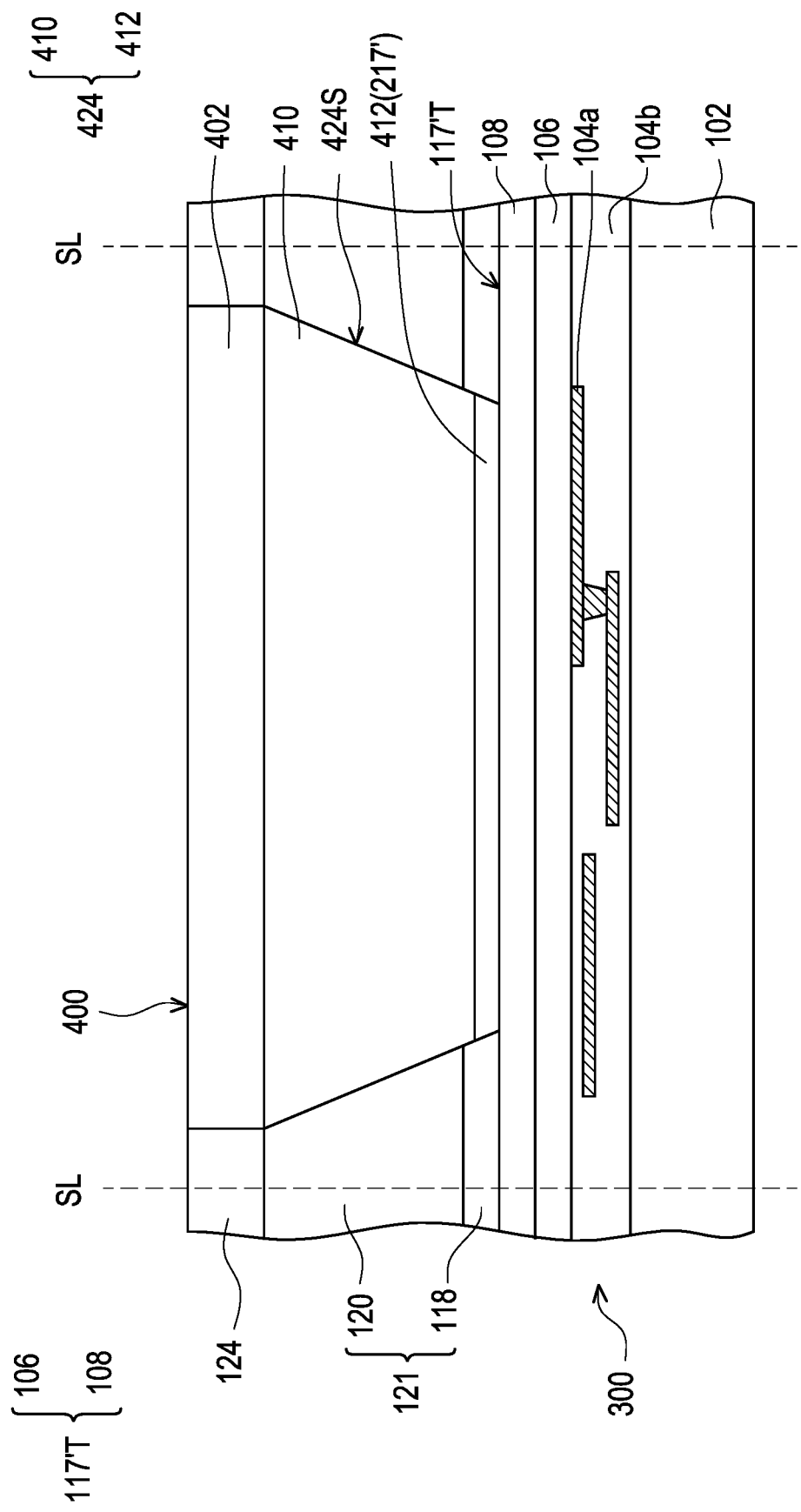
FIG. 15, FIG. 16 and FIG. 17 are cross-sectional views schematically illustrating various semiconductor structures in accordance with other embodiments of the present disclosure.
Figure 16:
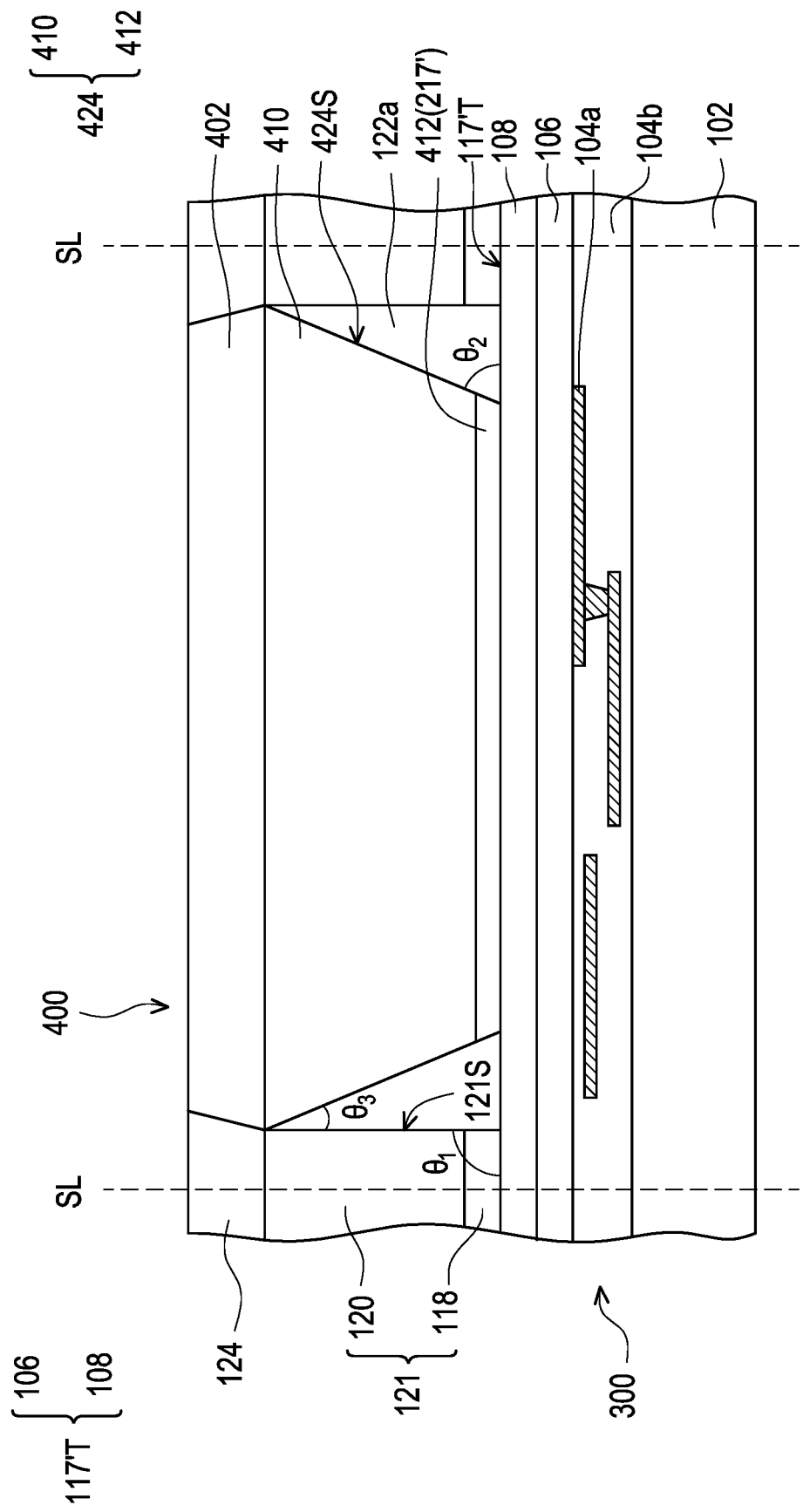
Figure 17:
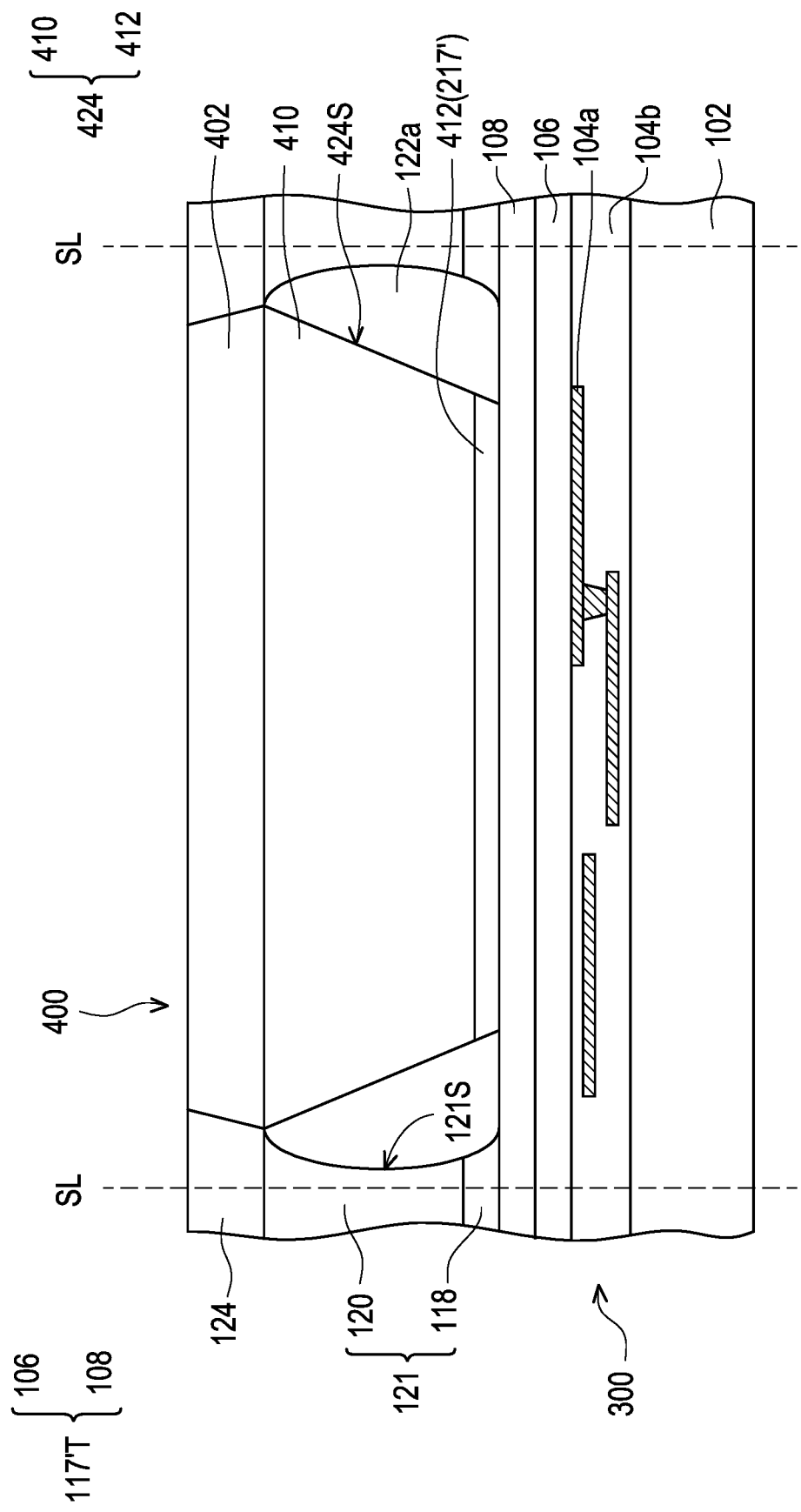

FIG. 15, FIG. 16 and FIG. 17 are cross-sectional views schematically illustrating various semiconductor structures in accordance with other embodiments of the present disclosure.

Referring to FIG. 15, in some embodiments, the bottom span of the semiconductor material portion 402 of the second die 400 is equivalent to the top span of the semiconductor material portion 402, so that the semiconductor material portion 402 of the second die 400 has a substantially vertical sidewall.

Referring to FIG. 16, in some embodiments, the second die 400 is not tightly fitted into the cavity opening 122, and there is a void between the dielectric portion 424 and the smoothing layer 121. In one embodiment, the angle $\theta_2$ is smaller than the angle $\theta_1$. In some embodiments, there is an angle $\theta_3$ sandwiched between the sidewall 121S of the smoothing layer 121 and the sidewall 424S of the dielectric portion 424. In some embodiments, the angle $\theta_3$ is equivalent to or smaller than a complement of $\theta_2$ sandwiched between the sidewall 424S and the top surface 117'T of the first bonding structure 117'. In some embodiments, the angle $\theta_3$ is smaller than a complement of the angle $\theta_2$ and the cavity opening 122 has a volume larger than a volume of the dielectric portion 424, so that there is an air gap 122a between the dielectric portion 424 and the sidewalls 121S of the smoothing layer 121. The air gap 122a surrounds the dielectric portion 424 of the second die 400, so that at least a portion of the dielectric portion 424 (i.e. the dielectric material layers 410, 412) is not in contact with the sidewalls 121S of the smoothing layer 121.

Referring to FIG. 17, in some embodiments, the smoothing layer 121 has curved bowl-shaped sidewalls 121S surrounding the dielectric portion 424 of the second die 400.

In accordance with some embodiments of the disclosure, a semiconductor structure including a first die, a second die stacked on the first die, a smoothing layer disposed on the first die and disposed around the second die and a filling material layer disposed on the smoothing layer and around the second die is provided. The second die has a dielectric portion disposed on the first die and a semiconductor material portion disposed on the dielectric portion. The smoothing layer includes a first dielectric layer disposed on the first die and a second dielectric layer disposed on the first dielectric layer. The smoothing layer surrounds the dielectric portion, sidewalls of the dielectric portion are isolated from the filling material layer by the smoothing layer, and the semiconductor material portion is surrounded and covered by the filling material layer. A material of the first dielectric layer is different from a material of the second dielectric layer and a material of the filling material layer.

In accordance with some embodiments of the disclosure, a semiconductor structure including a first die, a planarizing guard structure disposed on the first die, a second die on the first die and a filling material layer disposed over the second die is provided. The first die has a first bonding structure. The first bonding structure includes a first bonding film. The planarizing guard structure has a first dielectric layer disposed on the first bonding film and a second dielectric layer disposed on the first dielectric layer. The planarizing guard structure has a cavity opening penetrating through the planarizing guard structure and revealing a top surface of the first bonding film. The second die is located in the cavity opening of the planarizing guard structure. The second die has a dielectric portion and a semiconductor material portion disposed on the dielectric portion, and a top surface of the dielectric portion is not higher than a top surface of the planarizing guard structure, so that sidewalls of the dielectric portion is covered by the planarizing guard structure. The filling material layer is disposed on the planarizing guard structure and covering the semiconductor material portion of the second die. A sidewall of the dielectric portion forms an acute angle with the top surface of the first bonding film.

In accordance with some embodiments of the disclosure, a method for forming a semiconductor structure is provided. The method for forming a semiconductor structure includes providing a substrate having a first bonding structure formed thereon; forming a first dielectric layer over the substrate covering the first bonding structure; forming a second dielectric layer over the substrate covering the first dielectric layer; forming a cavity opening penetrating through the first dielectric layer and the second dielectric layer to reveal a top surface of the first bonding structure; disposing a die on the top surface of the first bonding structure revealed by the cavity opening; and forming a filling material layer on the die and over the substrate without filling into the cavity opening. The first bonding structure includes a first bonding film. The first dielectric layer has a first thickness. The second dielectric layer has a second thickness. A material of the second dielectric layer is different from a material of the first dielectric layer. The die has a dielectric portion and a semiconductor material portion disposed on the dielectric portion. The dielectric portion has a third thickness, and a sum of the first thickness and the second thickness is equivalent to or larger than the third thickness. The filling material layer covers the semiconductor material portion of the die and the second dielectric layer. A sidewall of the dielectric portion forms an acute angle with a top surface of the first bonding film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first die;
   a second die stacked on the first die, wherein the second die has a dielectric portion disposed on the first die and a semiconductor material portion disposed on the dielectric portion;
   a smoothing layer, disposed on the first die and disposed around the second die, wherein the smoothing layer comprises a first dielectric layer disposed on the first die and a second dielectric layer disposed on the first dielectric layer; and
   a filling material layer, disposed on the smoothing layer and around the second die, wherein the smoothing layer surrounds the dielectric portion, sidewalls of the dielectric portion are isolated from the filling material layer by the smoothing layer, and the semiconductor material portion is surrounded and covered by the filling material layer, and
   a material of the first dielectric layer is different from a material of the second dielectric layer and a material of the filling material layer.

2. The semiconductor structure according to claim 1, wherein the sidewalls of the dielectric portion are slant sidewalls, and a top span of the dielectric portion is larger than a bottom span of the dielectric portion.

3. The semiconductor structure according to claim 1, wherein the semiconductor material portion has slant sidewalls, and a top span of the semiconductor material portion is smaller than a bottom of the semiconductor material portion.

4. The semiconductor structure according to claim 1, wherein the semiconductor material portion is protruded from a sidewall of the dielectric portion and a bottom span of the semiconductor material portion is larger than a top span of the semiconductor material portion.

5. The semiconductor structure according to claim 1, wherein the smoothing layer has a cavity, the second die is located in the cavity and there is an air gap between the dielectric portion and sidewalls of the cavity of the smoothing layer.

6. The semiconductor structure according to claim 5, wherein the sidewalls of the cavity of the smoothing layer are curved sidewalls surrounding the dielectric portion.

7. The semiconductor structure according to claim 1, wherein the first die includes a first bonding film, and the second die includes a second bonding film, and the second die is bonded with the first die through the bonding of the first bonding film and the second bonding film.

8. The semiconductor structure according to claim 7, wherein the first die further includes first pads embedded in the first bonding film, and the second die further includes second pads embedded in the second bonding film, and the second die is bonded with the first die through the bonding of the first bonding film and the second bonding film and the bonding of the first pads and the second pads.

9. A semiconductor structure, comprising:
   a first die, having a first bonding structure, wherein the first bonding structure includes a first bonding film;
   a planarizing guard structure, disposed on the first die, wherein the planarizing guard structure has a first dielectric layer disposed on the first bonding film and a second dielectric layer disposed on the first dielectric layer, wherein the planarizing guard structure has a cavity opening penetrating through the planarizing guard structure and revealing a top surface of the first bonding film;
   a second die, disposed on the first die and located in the cavity opening of the planarizing guard structure, wherein the second die has a dielectric portion and a semiconductor material portion disposed on the dielectric portion, and a top surface of the dielectric portion is not higher than a top surface of the planarizing guard structure, so that sidewalls of the dielectric portion is covered by the planarizing guard structure; and
   a filling material layer, disposed over the second die, on the planarizing guard structure and covering the semiconductor material portion of the second die, wherein a sidewall of the dielectric portion forms an acute angle with the top surface of the first bonding film.

10. The semiconductor structure according to claim 9, wherein the semiconductor material portion is protruded beyond the sidewalls of the dielectric portion, and a bottom span of the semiconductor material portion is larger than a top span of the dielectric portion.

11. The semiconductor structure according to claim 10, wherein the second dielectric layer is in contact with the sidewalls of the dielectric portion and in contact with a bottom surface of the protruded part of the semiconductor material portion.

12. The semiconductor structure according to claim 9, wherein a volume of the cavity opening is larger than a volume of the dielectric portion and there is an air gap between the dielectric portion and the cavity opening of the planarizing guard structure.

13. The semiconductor structure according to claim 9, wherein the cavity opening of the planarizing guard structure has slant sidewalls facing the second die.

14. The semiconductor structure according to claim 9, wherein the cavity opening of the planarizing guard structure has curved sidewalls facing the second die.

15. The semiconductor structure according to claim 9, wherein an air gap separates the sidewalls of the dielectric portion from sidewalls of the cavity opening of the planarizing guard structure.

16. The semiconductor structure according to claim 9, wherein the second die includes a second bonding structure having a second bonding film, and the first die and the second die are bonded through the bonding of the first and second bonding films.

17. The semiconductor structure according to claim 16, wherein the first bonding structure further includes first pads embedded in the first bonding film, the second bonding structure further includes second pads embedded in the second bonding film, and the first die and the second die are bonded through the bonding of the first and second bonding films and the bonding of the first and second pads.

* * * * *